US012652919B2

(12) United States Patent
Wen et al.

(10) Patent No.: US 12,652,919 B2
(45) Date of Patent: Jun. 9, 2026

(54) LIGHT-EMITTING DEVICE AND LIGHT-EMITTING APPARATUS

(71) Applicant: BOE TECHNOLOGY GROUP CO., LTD., Beijing (CN)

(72) Inventors: Mengyang Wen, Beijing (CN); Shiming Shi, Beijing (CN); Tao Wang, Beijing (CN); Libin Liu, Beijing (CN); Hui Zhao, Beijing (CN); Guangliang Shang, Beijing (CN); Yanli Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 448 days.

(21) Appl. No.: 18/251,063

(22) PCT Filed: May 31, 2022

(86) PCT No.: PCT/CN2022/096430
§ 371 (c)(1),
(2) Date: Apr. 28, 2023

(87) PCT Pub. No.: WO2023/230904
PCT Pub. Date: Dec. 7, 2023

(65) Prior Publication Data
US 2024/0334773 A1 Oct. 3, 2024

(51) Int. Cl.
*H10K 59/131* (2023.01)
*H10K 59/10* (2023.01)

(52) U.S. Cl.
CPC ....... *H10K 59/1315* (2023.02); *H10K 59/221* (2023.02)

(58) Field of Classification Search
CPC ........ G09G 3/20; G09G 3/3208; H05B 47/19; H10K 59/1315; H10K 59/221
See application file for complete search history.

(56) References Cited

U.S. PATENT DOCUMENTS 8,474,726 B2 * 7/2013 Finn ................. G06K 19/07794
235/492
10,984,704 B2 * 4/2021 Huang ..................... G09G 3/32
(Continued)

FOREIGN PATENT DOCUMENTS

CN 113178534 A 7/2021
KR 10-2020-0117400 A 10/2020

OTHER PUBLICATIONS

Extended European Search Report in corresponding European Application No. 22944240.5, dated Mar. 5, 2025, in 10 pgs.

*Primary Examiner* — Andres Munoz
(74) *Attorney, Agent, or Firm* — Dority & Manning, P.A.

(57) ABSTRACT
A light-emitting device includes a substrate, an induction coil and at least one light-emitting unit. The induction coil is located on a side of the substrate, and the induction coil includes turns of conductive wiring disposed helically around a central region. The at least one light-emitting unit is located on a side of the induction coil away from the substrate. The light-emitting unit includes a first electrode and a second electrode, one of which is connected to an innermost turn of conductive wiring in the induction coil, and another one of which is connected to an outermost turn of conductive wiring in the induction coil. An area of a portion the central region covered by the at least one light-emitting unit in a direction perpendicular to the substrate is less than or equal to 50% of an area of the central region.

20 Claims, 28 Drawing Sheets

(56) References Cited

U.S. PATENT DOCUMENTS

| | | | |
|---|---|---|---|
| 2012/0153826 A1* | 6/2012 | Waffenschmidt | ...... H10K 59/00 |
| | | | 315/40 |
| 2017/0302336 A1* | 10/2017 | Rotzoll | ............ G06K 19/07705 |
| 2017/0373049 A1* | 12/2017 | Fischer | ................ H01L 25/167 |
| 2021/0321504 A1* | 10/2021 | Whitby | .................... G09F 3/02 |
| 2024/0188377 A1 | 6/2024 | Gu et al. | |
| 2024/0357901 A1* | 10/2024 | Zhao | ...................... H10K 59/82 |

* cited by examiner

560

530

PDL

EML

540

PDLO

420

100

300/310      200

531
5311   5312   5313

AA

5612

311

312

PDLO 410
420      400
430

510
560
530
PDL
EML
540

5611

C

530

PDL

EML

430

430

430

540

PDLO

420

530

100

560

5611
/561

5612
/561

530

532        410

5611

D

533

5612

PDL

PDL1

PDL1

PDL1

PDLO

EML

430

430

430

540

420

PDLO

100

300/310    200    532/533

PDLO

311

312

AA

5612
/561

410
420 ⎱ 400
430

C 510
560
530
PDL
EML
540

530

PDL

EML

430

430

430

540

PDLO

420

510

560

530

PDL

EML

430

430

430

540

420

PDLO 5.60

530

PDL

EML

540

PDLO

420

100

300/310          320          200

AA

311

312

410
420  } 400
430

LIGHT-EMITTING DEVICE AND LIGHT-EMITTING APPARATUS

CROSS-REFERENCE TO RELATED APPLICATION

This application is a national phase entry under 35 USC 371 of International Patent Application No. PCT/CN2022/096430, filed on May 31, 2022, which is incorporated herein by reference in its entirety.

TECHNICAL FIELD

The present disclosure relates to the field of display technologies, and in particular, to a light-emitting device and a light-emitting apparatus.

BACKGROUND

Many electronic devices (such as mobile phones and watches) are each provided with a driving coil therein. When the driving coil approaches a receiving coil, an induced electromotive force is generated in the receiving coil, and thus an induced current is generated.

SUMMARY

In an aspect, a light-emitting device is provided. The light-emitting device includes a substrate, an induction coil and at least one light-emitting unit. The induction coil is located on a side of the substrate, and the induction coil includes a plurality of turns of conductive wiring disposed helically around a central region. The at least one light-emitting unit is located on a side of the induction coil away from the substrate; a light-emitting unit in the at least one light-emitting unit includes a first electrode and a second electrode, one of the first electrode and the second electrode is connected to an innermost turn of conductive wiring in the induction coil, and another one of the first electrode and the second electrode is connected to an outermost turn of conductive wiring in the induction coil. An area of a portion of the central region covered by the at least one light-emitting unit in a direction perpendicular to the substrate is less than or equal to 50% of an area of the central region.

In some embodiments, an area of a portion of the induction coil covered by the at least one light-emitting unit in the direction perpendicular to the substrate is less than or equal to 15% of an area of the induction coil.

In some embodiments, an orthographic projection of the first electrode on the substrate is located at an outer side of an orthographic projection of the induction coil on the substrate.

In some embodiments, an orthographic projection of the second electrode on the substrate covers at least part of the orthographic projection of the first electrode on the substrate, and the second electrode crosses the plurality of turns of conductive wiring and is connected to the innermost turn of conductive wiring. The first electrode is electrically connected to the outermost turn of conductive wiring.

In some embodiments, the second electrode is located on a side of the first electrode away from the substrate. The light-emitting unit further includes a first transfer pattern, and the first transfer pattern is disposed in a same layer as the first electrode; the second electrode is connected to the first transfer pattern through a via hole, and the first transfer pattern is connected to the innermost turn of conductive wiring through another via hole.

In some embodiments, an orthographic projection of the first transfer pattern on the substrate is located at an inner side of the orthographic projection of the induction coil on the substrate.

In some embodiments, the first transfer pattern crosses the plurality of turns of conductive wiring. The first transfer pattern includes a first portion, a second portion and a third portion. An orthographic projection of the first portion on the substrate is located at an inner side of the orthographic projection of the induction coil on the substrate; an orthographic projection of the second portion on the substrate covers part of an orthographic projection of the plurality of turns of conductive wiring on the substrate; and an orthographic projection of the third portion on the substrate is located at the outer side of the orthographic projection of the induction coil on the substrate. The second electrode is connected to at least one of the first portion, the second portion and the third portion through the via hole.

In some embodiments, an orthographic projection of the second electrode on the substrate is substantially located at the outer side of the orthographic projection of the induction coil on the substrate. The second electrode is located on a side of the first electrode away from the substrate. The light-emitting unit further includes a first bridging pattern disposed in a same layer as the first electrode; an end of the first bridging pattern is connected to the innermost turn of conductive wiring through a via hole, and another end of the first bridging pattern crosses the plurality of turns of conductive wiring and is connected to the first electrode. The second electrode is connected to the outermost turn of conductive wiring.

In some embodiments, an orthographic projection of the second electrode on the substrate is substantially located at the outer side of the orthographic projection of the induction coil on the substrate. The second electrode is located on a side of the first electrode away from the substrate. The light-emitting unit further includes a first bridging pattern disposed in a same layer as the first electrode; an end of the first bridging pattern is connected to the innermost turn of conductive wiring through a via hole, and another end of the first bridging pattern crosses the plurality of turns of conductive wiring and is connected to the second electrode through another via hole. The first electrode is connected to the outermost turn of conductive wiring.

In some embodiments, the first bridging pattern and the first electrode are sequentially arranged along a first direction. In a second direction, a width of the first bridging pattern is less than a width of the first electrode; the second direction is perpendicular to the first direction, and the second direction is parallel to the substrate.

In some embodiments, an orthographic projection of the first electrode on the substrate is located at an inner side of an orthographic projection of the induction coil on the substrate. An orthographic projection of the second electrode on the substrate covers at least part of the orthographic projection of the first electrode on the substrate, and the second electrode crosses the plurality of turns of conductive wiring and is connected to the outermost turn of conductive wiring.

In some embodiments, the second electrode is located on a side of the first electrode away from the substrate. The light-emitting unit further includes a third transfer pattern, and the third transfer pattern is disposed in a same layer as the first electrode; the second electrode is connected to the third transfer pattern through a via hole, and the third transfer pattern is connected to the outermost turn of conductive wiring through another via hole.

In some embodiments, an orthographic projection of the first electrode on the substrate and an orthographic projection of the second electrode on the substrate are both located at an inner side of an orthographic projection of the induction coil on the substrate; the first electrode is electrically connected to the innermost turn of conductive wiring. The second electrode is located on a side of the first electrode away from the substrate. The light-emitting unit further includes a second bridging pattern, and the second bridging pattern is disposed in a same layer as the first electrode; an end of the second bridging pattern is connected to the outermost turn of conductive wiring through a via hole, and another end of the second bridging pattern crosses the plurality of turns of conductive wiring and is connected to the second electrode through another via hole.

In some embodiments, an orthographic projection of the first electrode on the substrate overlaps with an orthographic projection of at least two turns of conductive wiring in the plurality of turns of conductive wiring on the substrate.

In some embodiments, an orthographic projection of a portion of the first electrode on the substrate overlaps with the orthographic projection of the at least two turns of conductive wiring on the substrate, and an orthographic projection of another portion of the first electrode on the substrate is located at an outer side of an orthographic projection of the induction coil on the substrate; the another portion of the first electrode is connected to the outermost turn of conductive wiring. The second electrode is connected to the innermost turn of conductive wiring.

In some embodiments, an orthographic projection of a portion of the first electrode on the substrate overlaps with the orthographic projection of the at least two turns of conductive wiring on the substrate, and an orthographic projection of another portion of the first electrode on the substrate is located at an inner side of the orthographic projection of the induction coil on the substrate; the another portion of the first electrode is connected to the innermost turn of conductive wiring. The second electrode is connected to the outermost turn of conductive wiring.

In some embodiments, the at least one light-emitting unit includes multiple light-emitting units; first electrodes of at least two light-emitting units in the multiple light-emitting units are disposed at intervals, and areas of orthographic projections, on the substrate, of the first electrodes of the at least two light-emitting units are different. The at least two light-emitting units share a second electrode thereof.

In some embodiments, the at least two light-emitting units further share a connecting portion. The connecting portion is disposed in a same layer as the first electrodes of the at least two light-emitting units. The first electrodes of the at least two light-emitting units are electrically connected to the induction coil through the connecting portion.

In some embodiments, the light-emitting unit further includes at least one light-emitting portion located between the first electrode and the second electrode.

In some embodiments, the first electrode is an anode, and the second electrode is a cathode.

In another aspect, a light-emitting apparatus is provided. The light-emitting apparatus includes: a first protective layer, a second protective layer and the light-emitting device provided in the embodiments above, the light-emitting device is located between the first protective layer and the second protective layer.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, but are not limitations on actual sizes of products, actual processes of methods and actual timings of signals involved in the embodiments of the present disclosure.

DETAILED DESCRIPTION

Figure 1:
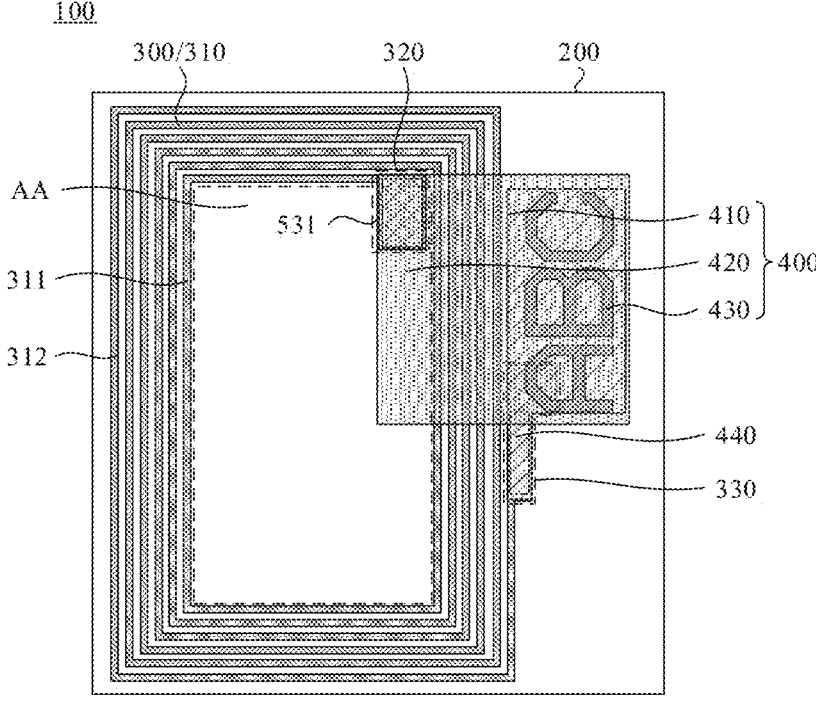
FIG. 1 is a structural diagram of a light-emitting device, in accordance with some embodiments.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "some embodiments", "example", or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the terms "a plurality of", "the plurality of" and "multiple" each mean two or more unless otherwise specified.

In the description of some embodiments, the terms "connected" and derivatives thereof may be used. For example, the term "connected" may be used in the description of some embodiments to indicate that two or more components are in direct physical or electrical contact with each other.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

In addition, the phrase "based on" used is meant to be open and inclusive, since a process, step, calculation or other action that is "based on" one or more of the stated conditions or values may, in practice, be based on additional conditions or values exceeding those stated.

As used herein, the term such as "about", "substantially" or "approximately" includes a stated value and an average value within an acceptable range of deviation of a particular value. The acceptable range of deviation is determined by a person of ordinary skill in the art in view of the measurement in question and errors associated with the measurement of a particular quantity (i.e., the limitation of the measurement system).

As used herein, the term such as "parallel", "perpendicular", or "equal" includes a stated condition and a condition similar to the stated condition. A range of the similar condition is within an acceptable range of deviation, and the acceptable range of deviation is determined by a person of ordinary skill in the art in view of measurement in question and errors associated with the measurement of a particular quantity (i.e., the limitation of the measurement system). For example, the term "parallel" includes absolute parallelism and approximate parallelism, and an acceptable range of deviation of the approximate parallelism may be, for example, a deviation within 5°. The term "perpendicular" includes absolute perpendicularity and approximate perpendicularity, and an acceptable range of deviation of the approximate perpendicularity may also be, for example, a deviation within 5°. The term "equal" includes absolute equality and approximate equality, and an acceptable range of deviation of approximate equality may be, for example, that a difference between two equals is less than or equal to 5% of any one of the two equals.

It will be understood that, in a case where a layer or component is referred to as being on another layer or a substrate, it may be that the layer or component is directly on the another layer or substrate; or it may be that intermediate layer(s) exist between the layer or component and the another layer or substrate.

Exemplary embodiments are described herein with reference to sectional views and/or plan views as idealized exemplary drawings. In the accompanying drawings, thicknesses of layers and sizes of regions are enlarged for clarity. Variations in shape relative to the accompanying drawings due to, for example, manufacturing technologies and/or tolerances may be envisaged. Therefore, the exemplary embodiments should not be construed as being limited to the shapes of the regions shown herein, but including deviations due to, for example, manufacturing. For example, an etched region shown to have a rectangular shape generally has a feature of being curved. Therefore, the regions shown in the accompanying drawings are schematic in nature, and their shapes are not intended to show actual shapes of regions in an apparatus, and are not intended to limit the scope of the exemplary embodiments.

Some embodiments of the present disclosure provide a light-emitting device.

FIG. 1 is a structural diagram of the light-emitting device 100, in accordance with some embodiments. Referring to FIG. 1, the light-emitting device 100 includes a substrate 200, an induction coil 300, and at least one light-emitting unit 400.

The substrate 200 may be made of a hard insulating material or a flexible insulating material. The substrate 200 may be an inorganic insulating layer, and may be a glass plate, a quartz plate, a metal plate, a resin-based plate, or the like. For example, the substrate 200 may be made of silicon nitride, or silicon oxide. The substrate 200 may also be an organic insulating layer. For example, the substrate 200 is made of a resin material such as polyimide resin, polycarbonate, polyacrylate, polyetherimide, polyethersulfone, polyethylene terephthalate, or polyethylene naphthalate. For example, the substrate 200 may be formed of a plurality of material layers. The material layers may be made of the materials described above.

The induction coil 300 may be made of a metal material. For example, the metal material may be copper, aluminum, a ferromagnetic material, or the like.

Referring to FIG. 1, the induction coil 300 is located on a side of the substrate 200. The induction coil 300 includes a plurality of turns of conductive wiring 310 disposed helically around a central region AA.

It will be noted that, an edge of the dashed box indicated by AA and an edge of the conductive wiring 310 in FIG. 1 are separated from each other, which is only for convenience of illustrating the central region AA, and the central region AA is not further limited.

The induction coil 300 is disposed helically around the central region AA and spreads out. That is, the induction coil 300 extends in a helical direction. The induction coil 300 includes a first end 320 and a second end 330. The first end 320 is an end of the induction coil 300 proximate to the central region AA, and the second end 330 is an end of the induction coil 300 away from the central region AA. Therefore, a distance between the first end 320 and the central region AA is less than a distance between the second end 330 and the central region AA. It will be noted that, an edge of the dashed box indicated by 320 in FIG. 1 and the edge of the conductive wiring 310 are separated from each other, which is only for convenience of illustrating the first end 320, and the first end 320 is not further limited. Similarly, an edge of the dashed box indicated by 330 in FIG. 1 and the edge of the conductive wiring 310 are separated from each other, which is only for convenience of illustrating the second end 330, and the second end 330 is not further limited.

The central region AA can also be understood as a region surrounded by an innermost turn of conductive wiring 311.

Referring to FIG. 1, starting from the first end 320, a portion of the induction coil 300 spreads around the central region AA for a circle is a first turn of conductive wiring 310; starting from an end point of the first turn of conductive wiring 310, a portion of the induction coil 300 spreads around the central region AA for a circle is a second turn of conductive wiring 310; and so forth. Thus, the plurality of turns of conductive wiring 310 may be formed.

Under an action of a driving coil, an induced electromotive force is formed in the induction coil 300, and thus an induced current is formed. The induced electromotive force in the induction coil 300 is in a direct proportion to the number of turns, and a potential of the conductive wiring 310 gradually increases as the number of turns increases.

Therefore, for the induction coil 300, a potential of the innermost turn of conductive wiring 311 is different from a potential of an outermost turn of conductive wiring 312.

For example, the induction coil 300 includes N turns of conductive wiring 310. The first turn of conductive wiring 310 is the innermost turn of conductive wiring 311, and an N-th turn of conductive wiring 310 is the outermost turn of conductive wiring 312. For example, referring to FIG. 1, the induction coil 300 includes six turns of conductive wiring 310, and the sixth turn of conductive wiring 310 is the outermost turn of conductive wiring 312.

It can be understood that, the first end 320 belongs to the innermost turn of conductive wiring 311, and the second end 330 belongs to the outermost turn of conductive wiring 312.

In some examples, referring to FIG. 1, the induction coil 300 is substantially in a shape of a rectangle. In some other examples, the induction coil 300 may have another polygonal shape such as a pentagonal shape or a hexagonal shape, or may have a circular shape.

Referring to FIG. 1, the at least one light-emitting unit 400 is located on a side of the induction coil 300 away from substrate 200. The light-emitting unit 400 includes a first electrode 410 and a second electrode 420.

In some examples, the light-emitting unit 400 is an organic light-emitting diode (OLED). In this case, referring to FIG. 1, the light-emitting unit 400 includes at least one light-emitting portion 430 in addition to the first electrode 410 and the second electrode 420. The at least one light-emitting portion 430 is located between the first electrode 410 and the second electrode 420.

In some examples, the light-emitting unit 400 includes one light-emitting portion 430.

In some other examples, referring to FIG. 1, the light-emitting unit 400 includes a plurality of light-emitting portions 430. In this case, the plurality of light-emitting portions 430 share the first electrode 410 and the second electrode 420.

The light-emitting portion 430 may be made of an organic material. One of the first electrode 410 and the second electrode 420 is an anode, and another of the first electrode 410 and the second electrode 420 is a cathode. A voltage is applied across the anode and the cathode to generate an electric field between the anode and the cathode, holes in the anode and electrons in the cathode may be driven by the electric field to be recombined in the light-emitting portion 430, so that light is emitted.

Figure 2:
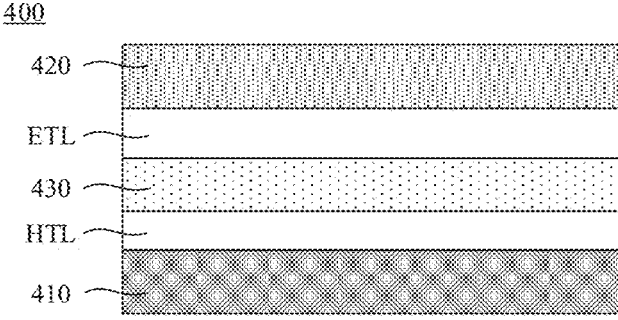
FIG. 2 is a structural diagram of a light-emitting unit, in accordance with some embodiments.

FIG. 2 is a structural diagram of the light-emitting unit 400, in accordance with some embodiments.

Referring to FIG. 2, in some examples, at least one of a hole injection layer (HIL), a hole transport layer (HTL), and an electron blocking layer (EBL) is provided between the anode and a light-emitting layer EML; at least one of an electron injection layer (EIL), an electron transport layer (ETL) and a hole blocking layer (HBL) is provided between the cathode and the light-emitting layer. Thus, the light-emitting efficiency of the OLED (light-emitting unit) is improved.

In some examples, the light-emitting portion 430 of the light-emitting unit 400 may emit any one of blue light, red light, green light, and white light.

In some examples, the light-emitting unit 400 may include the plurality of light-emitting portions 430. In this case, the plurality of light-emitting portions 430 of the light-emitting unit 400 may emit light of different colors, so that the light-emitting unit 400 may have a colorful display effect.

In some examples, the second electrode 420 is located on a side of the first electrode 410 away from the substrate 200.

For example, the first electrode 410 is the anode, and second electrode 420 is the cathode.

In some examples, the first electrode 410 may be of a stacked composite structure such as transparent conductive oxide/metal/transparent conductive oxide. The transparent conductive oxide material is, for example, indium tin oxide (ITO) or indium zinc oxide (IZO). The metal material is, for example, gold (Au), silver (Ag), nickel (Ni), or platinum (Pt). For example, the first electrode 410 is of a structure of ITO/Ag/ITO.

In some examples, the second electrode 420 may be a light-transmissive electrode or a semi-transmissive electrode. For example, the second electrode 420 is made of a transparent conductive oxide material, such as ITO or IZO. For example, the second electrode 420 may also be made of a metal alloy, such as an alloy of magnesium (Mg) and Ag.

The substrate 200, the induction coil 300 and the light-emitting unit 400 in the embodiments of the present disclosure are described below in combination of a sectional view of the light-emitting device 100.

Figure 3:
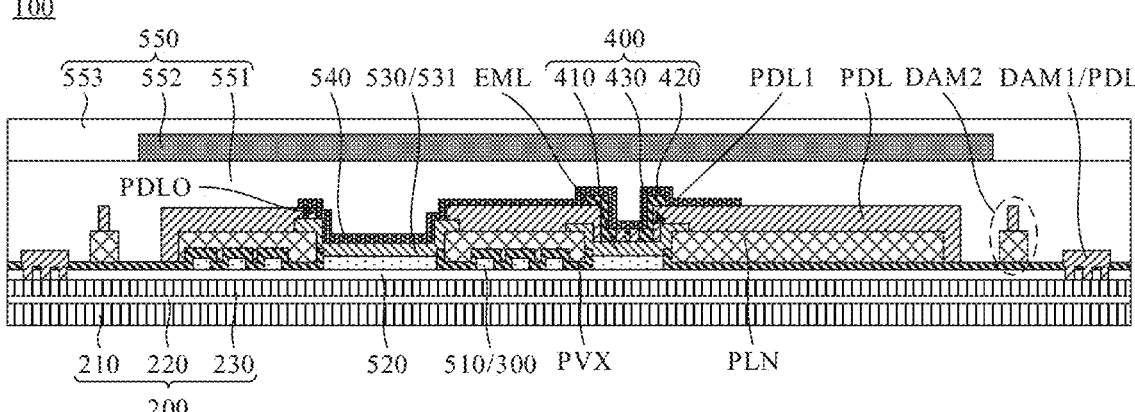
FIG. 3 is a sectional view of a light-emitting device, in accordance with some embodiments.

FIG. 3 is the sectional view of the light-emitting device 100, in accordance with some embodiments.

Referring to FIG. 3, the substrate 200 includes a first substrate layer 210, a barrier layer 220 and a second substrate layer 230 that are stacked in sequence.

The first substrate layer 210 and the second substrate layer 230 may be made of polyimide (PI). In this case, the first substrate layer 210 and the second substrate layer 230 are flexible substrates and are capable of being bent.

The barrier layer 220 may be made of SiN, SiO, or the like.

Referring to FIG. 3, conductive layer(s) 510 are formed on a side of the substrate 200, and the induction coil 300 is included in the conductive layer 510. The induction coil 300 may be formed by an etching process.

In some examples, a plurality of conductive layers 510 may be included in the light-emitting device 100, and one or more induction coils 300 may be included in one conductive layer 510. Induction coils 300 in the plurality of conductive layers 510 may be arranged in parallel. That is, first ends 320 of the induction coils 300 are electrically connected, and second ends 330 of the induction coils 300 are electrically connected. The induction coils 300 are arranged in parallel, which may reduce the resistance of the induction coils 300, thereby increasing the induced current on the induction coils 300, and increasing the luminance of the light-emitting unit 400.

In some examples, a buffer layer 520 is further formed on the side of the substrate 200. The buffer layer 520 is located between the conductive layer 510 and the substrate 200, and the buffer layer 520 has a function of blocking water and air. In addition, the buffer layer 520 may also prevent impurities in the substrate from contaminating the light-emitting unit 400.

Referring to FIG. 3, a passivation layer PVX is formed on a side of the conductive layer 510 away from the substrate 200. The passivation layer PVX may protect the conductive layer 510 from being oxidized. For example, the passivation layer PVX may be made of an inorganic insulating material, such as SiN.

A planarization layer PLN, a first electrode layer 530, a pixel defining layer PDL, the light-emitting layer EML, and a second electrode layer 540 are sequentially formed on a side of the passivation layer PVX away from the substrate 200. The first electrode 410 is included in the first electrode layer 530, the light-emitting portions 430 are included in the light-emitting layer EML, and the second electrode 420 is included in the second electrode layer 540. Pixel openings PDL1 are formed in the pixel defining layer PDL, and the light-emitting portion 430 of the light-emitting layer EML may be disposed in the pixel opening PDL1. In addition, a via hole PDLO is formed in the pixel defining layer PDL, and an electrode in the second electrode layer 540 may be electrically connected to an electrode in the first electrode layer 530 through the via hole PDLO.

In some embodiments of the present disclosure, by providing the planarization layer PLN, it may be possible to increase a distance between the first electrode 410 and the induction coil 300, thereby reducing the parasitic capacitance formed between the first electrode 410 and the induction coil 300 and reducing the disturbance to the electromagnetic effect of the induction coil 300.

Similarly, by providing the planarization layer PLN, it may be possible to increase a distance between the second electrode 420 and the induction coil 300, thereby reducing the parasitic capacitance formed between the second electrode 420 and the induction coil 300 and reducing the disturbance to the electromagnetic effect of the induction coil 300.

For example, the planarization layer PLN may be made of an organic insulating material. Referring to FIG. 3, an encapsulation layer 550 is further formed on a side of the second electrode layer 540 away from the substrate 200. The encapsulation layer 550 covers the light-emitting unit 400 and is located on a side of the light-emitting unit 400 away from the substrate 200. The encapsulation layer may wrap the light-emitting unit 400 to avoid water vapor and oxygen in the external environment from entering the light-emitting device 100 and damaging the organic material in the light-emitting unit 400.

In a case where the second electrode layer 540 is located on a side of the first electrode layer 530 away from the substrate 200, the encapsulation layer 550 is located on the side of the second electrode layer 540 away from the substrate 200.

For example, the encapsulation layer 550 includes a first inorganic layer 551, an organic layer 552 and a second inorganic layer 553 that are sequentially disposed on the side of the light-emitting unit 400 away from the substrate 200.

In some examples, as shown in FIG. 3, the light-emitting device 100 further includes a first barrier wall DAM1. The first barrier wall DAM1 is located on a side of the buffer layer 520 away from the substrate 200; a via hole is formed in the buffer layer 520, and a portion of the first barrier wall DAM1 is located in the via hole in the buffer layer 520. The first barrier wall DAM1 is disposed around edges of the substrate 200.

In some examples, when the light-emitting device 100 is formed, buffer layers 520, conductive layers 510, passivation layers PVX, planarization layers PLN, first electrode layers 530, pixel defining layers PDL, light-emitting layers EML, second electrode layers 540, and encapsulation layers 550 are sequentially formed on a base substrate to form a single-plate structure; and then the single-plate structure is cut to form a plurality of light-emitting devices 100.

The light-emitting device 100 is provided with the first barrier wall DAM1. Therefore, when the single-plate structure is cut, the light-emitting device 100 may be avoided from being cracked.

For example, at least part of the first barrier wall DAM1 may be disposed in a same layer as the pixel defining layer PDL. That is, at least part of the first barrier wall DAM1 is formed in a same process as the pixel defining layer PDL.

Referring to FIG. 3, in some examples, the light-emitting device 100 further includes a second barrier wall DAM2. The second barrier wall DAM2 is disposed around the induction coil 300 for a circle, and an orthographic projection of the second barrier wall DAM2 on the substrate 200 is located between an orthographic projection of the first barrier wall DAM1 on the substrate 200 and an orthographic projection of the induction coil 300 on the substrate 200.

In some examples, a portion of the second barrier wall DAM2 is disposed in a same layer as the planarization layer PLN, and remaining portion is disposed in the same layer as the pixel defining layer PDL.

By providing the second barrier wall DAM2 of the light-emitting device 100, it may be possible to reduce the external moisture entering the light-emitting device 100, thereby prolonging the service life of the light-emitting device 100.

A positional relationship between the first electrode 410 of the light-emitting unit 400 and the induction coil 300 and a positional relationship between the second electrode 420 of the light-emitting unit 400 and the induction coil 300 will be described below.

With continued reference to FIG. 1, the innermost turn of conductive wiring 311 and the outermost turn of conductive wiring 312 in the induction coil 300 have different potentials. In the first electrode 410 and the second electrode 420, one is connected to the innermost turn of conductive wiring 311 in the induction coil 300, and the other one is connected to the outermost turn of conductive wiring 312 in the induction coil 300. As can be seen from the description above, the potential of the innermost turn of conductive wiring 311 is different from the potential of the outermost turn of conductive wiring 312. Therefore, a potential of the first electrode 410 is different from a potential of the second electrode 420. As a result, a potential difference may be formed between the first electrode 410 and the second electrode 420, thereby driving the light-emitting unit 400 to emit light.

In some examples, the first electrode 410 is connected to the innermost turn of conductive wiring 311 in the induction coil 300. For example, the first electrode 410 is connected to the first end 320. The second electrode 420 is connected to the outermost turn of conductive wiring 312 in the induction coil 300. For example, the second electrode 420 is connected to the second end 330.

In some other examples, referring to FIG. 1, the second electrode 420 is connected to the innermost turn of conductive wiring 311 in the induction coil 300. For example, the second electrode 420 is connected to the first end 320. The first electrode 410 is connected to the outermost turn of conductive wiring 312 in the induction coil 300. For example, the first electrode 410 is connected to the second end 330.

It will be noted that, in the related art, an induction coil has a relatively poor driving capability. The driving capability refers to an intensity of the induced current on the induction coil, and the greater the intensity of the induced current, the stronger the driving capability, and the greater the luminance of a light-emitting unit. The poorer the driving capability, the smaller the intensity of the induced current; and the poorer the driving capability, the lower the luminance of the light-emitting unit. Therefore, in the related art, the luminance of the light-emitting unit is low.

In light of this, the light-emitting device 100 is provided in some embodiments of the present disclosure. With reference to FIG. 1, for the light-emitting device 100, an area of a portion of the central region AA of the induction coil 300 covered by the at least one light-emitting unit 400 in a direction perpendicular to the substrate 200 (i.e., in a thickness direction of the substrate 200) is less than or equal to 50% of an area of the central region AA.

In the description above, the light-emitting device 100 includes at least one light-emitting unit 400. It will be understood that, the area of the portion of the central region AA covered by the at least one light-emitting unit 400 in the direction perpendicular to the substrate 200 means an area of a portion of the central region AA covered by all light-emitting units 400 in the direction perpendicular to the substrate 200.

For convenience of description, "the area of the portion of the central region AA covered by the light-emitting unit 400 in the direction perpendicular to the substrate 200" is simply referred to as "the area of the portion of the central region AA covered by the light-emitting unit 400". In addition, in the following description of some embodiments, "an area of a portion of the central region AA covered by a certain structure" may be used to mean "the area of the portion of the central region AA covered by the certain structure in the direction perpendicular to the substrate 200".

The central region AA is a region surrounded by the innermost turn of conductive wiring 311. Therefore, the portion of the central region AA being covered by the light-emitting unit 400 means that a region covered by an orthographic projection of the light-emitting unit 400 on the substrate 200 overlaps with a region surrounded by an orthographic projection of the innermost turn of conductive wiring 311 on the substrate 200. The region covered by the orthographic projection of the light-emitting unit 400 on the substrate 200 includes a region covered by orthographic projections, on the substrate 200, of structures such as the first electrode 410, the second electrode 420 and the light-emitting portion(s) 430 of the light-emitting unit 400.

The area of the portion of the central region AA covered by the light-emitting unit 400 will be illustrated by considering an example in which the light-emitting unit 400 includes the first electrode 410 and the second electrode 420.

An orthographic projection of the first electrode 410 of the light-emitting unit 400 on the substrate 200 at least partially overlaps with an orthographic projection of the second electrode 420 on the substrate 200.

In some examples, the orthographic projection of the first electrode 410 on the substrate 200 all falls in the orthographic projection of the second electrode 420 on the substrate 200. In this case, the area of the portion of the central region AA covered by the light-emitting unit 400 is equal to an area of a portion of the central region AA covered by the second electrode 420.

In some other examples, the orthographic projection of the first electrode 410 on the substrate 200 partially falls in the orthographic projection of the second electrode 420 on the substrate 200. The first electrode 410 includes a first electrode portion and a second electrode portion, an orthographic projection of the first electrode portion on the substrate 200 falls in the orthographic projection of the second electrode 420 on the substrate 200, and an orthographic projection of the second electrode portion on the substrate 200 falls at an outer side of the orthographic projection of the second electrode 420 on the substrate 200. In this case, the area of the portion of the central region AA covered by the light-emitting unit 400 is equal to a sum of an area of a portion of the central region AA covered by the second electrode 420 and an area of a portion of the central region AA covered by the second electrode portion.

In the embodiments of the present disclosure, the area of the portion of the central region AA covered by the at least one light-emitting unit 400 in the direction perpendicular to the substrate 200 is less than or equal to 50% of the area of the central region AA, which may avoid that the area of the portion of the central region AA covered by the light-emitting unit 400 is too large (e.g., greater than 50% of the area of the central region AA), resulting in the magnetic flux of the induction coil 300 being too small. Thus, the induction coil 300 may be ensured to have a relatively large induced electromotive force, thereby having a relatively large induced current. As a result, the light-emitting unit 400 has relatively high luminance.

In some embodiments, referring to FIG. 1, an area of a portion of the induction coil 300 covered by the at least one light-emitting unit 400 in the direction perpendicular to the substrate 200 is less than or equal to 15% of an area of the induction coil 300.

In the description above, the light-emitting device 100 includes at least one light-emitting unit 400. It will be understood that, the area of the portion of the induction coil 300 covered by the at least one light-emitting unit 400 in the direction perpendicular to the substrate 200 means an area of a portion of the induction coil 300 covered by all light-emitting units 400 in the direction perpendicular to the substrate 200.

In some examples, the orthographic projection of the first electrode 410 on the substrate 200 all falls in the orthographic projection of the second electrode 420 on the substrate 200. In this case, the area of the portion of the induction coil 300 covered by the light-emitting unit 400 is equal to an area of a portion of the induction coil 300 covered by the second electrode 420.

In some other examples, the orthographic projection of the first electrode 410 on the substrate 200 partially falls in the orthographic projection of the second electrode 420 on the substrate 200. The first electrode 410 includes the first electrode portion and the second electrode portion. The orthographic projection of the first electrode portion on the substrate 200 falls in the orthographic projection of the second electrode 420 on the substrate 200, and the orthographic projection of the second electrode portion on the substrate 200 falls at the outer side of the orthographic projection of the second electrode 420 on the substrate 200. In this case, the area of the portion of the induction coil 300 covered by the light-emitting unit 400 is equal to a sum of an area of a portion of the induction coil 300 covered by the second electrode 420 and an area of a portion of the induction coil 300 covered by the second electrode portion.

For convenience of description, "the area of the portion of the induction coil 300 covered by the at least one light-emitting unit 400 in the direction perpendicular to the substrate 200" is simply referred to as "the area of the portion of the induction coil 300 covered by the at least one light-emitting unit 400". In addition, in the following description of some embodiments, "an area of a portion of the induction coil 300 covered by the certain structure" may be used to mean "the area of the portion of the induction coil 300 covered by the certain structure in the direction perpendicular to the substrate 200".

The driving coil is connected to a power supply source, and thus a magnetic field may be formed. When the driving coil approaches the induction coil 300, the induction coil 300 cuts magnetic induction lines, and thus the current may be generated on the induction coil 300. When the induction coil 300 is covered by the light-emitting unit 400, the light-emitting unit 400 may impede the induction coil 300 cutting the magnetic induction lines, resulting in a reduction in the induced current on the induction coil 300.

In the embodiments of the present disclosure, the area of the portion of the induction coil 300 covered by all light-emitting units 400 is less than or equal to 15% of the area of the induction coil 300. Thus, it may be possible to avoid that the area of the portion of the induction coil 300 covered by the light-emitting units 400 is too large (e.g., greater than 15% of the area of the induction coil 300), which results in an area of the induction coil 300 capable of cutting the magnetic induction lines being too small, and results in a relatively low electromotive force, thereby causing the induced current on the induction coil 300 to be too small. Therefore, by making the area of the portion of the induction coil 300 covered by all light-emitting units 400 be less than or equal to 15% of the area of the induction coil 300, it may be possible to increase the area of the induction coil 300 for cutting the magnetic induction lines, thereby increasing the induced electromotive force in the induction coil 300, and increasing the induced current on the induction coil 300. In this way, the luminance of the light-emitting units 400 can be improved.

There may be various relative positional relationships between the light-emitting unit 400 and the induction coil 300, and the relative positional relationships will be described below.

Referring to FIG. 1, in some embodiments, the orthographic projection of the first electrode 410 on the substrate 200 is located at an outer side of the orthographic projection of the induction coil 300 on the substrate 200.

Firstly, it will be noted that, the outer side of the orthographic projection of the induction coil 300 on the substrate 200 is located at a side, away from an orthographic projection of the innermost turn of conductive wiring 311 on the substrate 200, of an orthographic projection of the outermost turn of conductive wiring 312 on the substrate 200, and an inner side of the orthographic projection of the induction coil 300 on the substrate 200 refers to the region surrounded by the orthographic projection of the innermost turn of conductive wiring 311 on the substrate 200.

A portion of the second electrode 420 overlapping with the first electrode 410 is a body portion of the second electrode 420, and the body portion of the second electrode 420 overlaps with part or all of the first electrode 410. In the case where the orthographic projection of the first electrode 410 on the substrate 200 is located at the outer side of the orthographic projection of the induction coil 300 on the substrate 200, an orthographic projection of the body portion of the second electrode 420 on the substrate 200 is also located at the outer side of the orthographic projection of the induction coil 300 on the substrate 200.

For convenience of description, "the orthographic projection of the first electrode 410 on the substrate 200 being located at the outer side of the orthographic projection of the induction coil 300 on the substrate 200" is simply referred to as the first electrode 410 being located at the outer side of the induction coil 300; "the orthographic projection of the first electrode 410 on the substrate 200 being located at the inner side of the orthographic projection of the induction coil 300 on the substrate 200" is simply referred to as the first electrode 410 being located at the inner side of the induction coil 300. In addition, in the following description of some embodiments, "a certain structure being located at the outer side of the induction coil 300" may also be used to mean "an orthographic projection of the certain structure on the substrate 200 being located at the outer side of the orthographic projection of the induction coil 300 on the substrate 200", and "a certain structure being located at the inner side of the induction coil 300" may be used to mean "an orthographic projection of the certain structure on the substrate 200 being located at the inner side of the orthographic projection of the induction coil 300 on the substrate 200".

In some embodiments of the present disclosure, referring to FIG. 1, in a case where the body portion of the second electrode 420 and the first electrode 410 are located at the outer side of the induction coil 300, an area of the light-emitting unit 400 at the inner side of the induction coil 300 may be reduced. The area of the light-emitting unit 400 at the inner side of the induction coil 300 is the area of the portion of the central region AA covered by the light-emitting unit 400. Thus, the area of the portion of the central region AA covered by the light-emitting unit 400 may be reduced. As a result, the magnetic flux of the induction coil 300 can be increased, and the induced electromotive force in the induction coil 300 can be increased, thereby increasing the induced current on the induction coil 300, and improving the luminance of the light-emitting unit 400.

In the case where the first electrode 410 is located at the outer side of the induction coil 300, the first electrode 410 may be connected to the outermost turn of conductive wiring 312. In this case, the second electrode 420 is connected to the innermost turn of conductive wiring 311. However, the first electrode 410 may be connected to the innermost turn of conductive wiring 311, and the second electrode 420 may be connected to the outermost turn of conductive wiring 312.

Embodiments in which the first electrode 410 is connected to the outermost turn of conductive wiring 312 and the second electrode 420 is connected to the innermost turn of conductive wiring 311 will be firstly described below.

In some embodiments, referring to FIG. 1, the light-emitting unit 400 further includes a connecting portion 440. The connecting portion 440 is disposed in a same layer as the first electrode 410 and is connected to the first electrode 410. An orthographic projection of the connecting portion 440 on the substrate 200 overlaps with an orthographic projection of a portion of the outermost turn of conductive wiring 312 on the substrate 200, and the connecting portion 440 is connected to the outermost turn of conductive wiring 312 through a via hole, so that the first electrode 410 and the outermost turn of conductive wiring 312 are electrically connected through the connecting portion 440. For example, the first electrode 410 is connected to the second end 330 through the via hole.

In the case where the light-emitting unit 400 further includes the connecting portion 440, the region covered by the orthographic projection of the light-emitting unit 400 on the substrate 200 includes a region covered by orthographic projections, on the substrate 200, of the first electrode 410, the second electrode 420, the light-emitting portion(s) 430 and the connecting portion 440 of the light-emitting unit 400.

In some examples, the orthographic projection of the second electrode 420 on the substrate 200 may cover part of the orthographic projection of the connecting portion 440 on the substrate 200. In some other examples, the orthographic projection of the second electrode 420 on the substrate 200 may cover all of the orthographic projection of the connecting portion 440 on the substrate 200.

In some embodiments, referring to FIG. 1, the orthographic projection of the second electrode 420 on the substrate 200 covers at least part of the orthographic projection of the first electrode 410 on the substrate 200. As can be seen from the description above, the first electrode 410 is located at the outer side of the induction coil 300. Therefore, part of the second electrode 420 is located at the outer side of the induction coil 300.

In some examples, the orthographic projection of the second electrode 420 on the substrate 200 overlaps with all of the orthographic projection of the first electrode 410 on the substrate 200. In some other examples, the orthographic projection of the second electrode 420 on the substrate 200 overlaps with part of the orthographic projection of the first electrode 410 on the substrate 200.

In addition, referring to FIG. 1, the second electrode 420 crosses the plurality of turns of conductive wiring 310 and is connected to the innermost turn of conductive wiring 311. It will be noted that "crossing" here means that the orthographic projection of the second electrode 420 on the substrate 200 partially overlaps with an orthographic projection of the plurality of turns of conductive wiring 310 on the substrate 200. The second electrode 420 crosses each turn of conductive wiring 310. That is, the orthographic projection of the second electrode 420 on the substrate 200 overlaps with an orthographic projection of a portion of each turn of conductive wiring 310 on the substrate 200.

Tests are performed by using two induction coils 300 with a same specification, and the same specification means that the two induction coils 300 have the same shape and size. For the same specification, it can also be understood that the two induction coils 300 have the same inner diameter, the same outer diameter, the same line width, and the same number of turns.

It have been found through tests that, when the first electrode 410 is located at the outer side of the induction coil 300, and in the case where the first electrode 410 is electrically connected to the outermost turn of conductive wiring 312, and the second electrode 420 is electrically connected to the innermost turn of conductive wiring 311, an induced voltage across two ends of the induction coil 300 is 3.92 V. When the first electrode 410 is located at the outer side of the induction coil 300, and in the case where the first electrode 410 is electrically connected to the innermost turn of conductive wiring 311, and the second electrode 420 is electrically connected to the outermost turn of conductive wiring 312, an induced voltage across two ends of the induction coil 300 is 3.44 V. The higher the induced voltage across the two ends of the induction coil 300 is, the higher the luminance of the light-emitting unit 400 is. Therefore, when the first electrode 410 is located at the outer side of the induction coil 300, and in the case where the first electrode 410 is electrically connected to the outermost turn of conductive wiring 312, and the second electrode 420 is connected to the innermost turn of conductive wiring 311, the light-emitting unit 400 has a relatively high luminance.

In some embodiments, the second electrode 420 and the innermost turn of conductive wiring 311 may be connected through a via hole.

In some other embodiments, referring to FIG. 3, the second electrode 420 is located at the side of the first electrode 410 away from the substrate 200. The light-emitting unit 400 further includes a first transfer pattern 531, and the first transfer pattern 531 is disposed in the same layer as the first electrode 410. The second electrode 420 is connected to the first transfer pattern 531 through a via hole. The first transfer pattern 531 is connected to the innermost turn of conductive wiring 311 through another via hole. The innermost turn of conductive wiring 311 is not shown in FIG. 3, but may refer to FIG. 1.

Referring to FIG. 3, the pixel defining layer PDL is formed on a side of the first transfer pattern 531 away from the substrate 200, the via hole PDLO is formed in the pixel defining layer PDL, and an orthographic projection of the first transfer pattern 531 on the substrate 200 covers an orthographic projection of a boundary of the via hole PDLO on the substrate 200. The second electrode 420 is connected to the first transfer pattern 531 through the via hole PDLO.

In some examples, referring to FIG. 1, the orthographic projection of the second electrode 420 on the substrate 200 may cover all of the orthographic projection of the first transfer pattern 531 on the substrate 200. In this case, the first transfer pattern 531 is provided without increasing the area of the portion of the central region AA covered by the light-emitting unit 400. Similarly, the first transfer pattern 531 does not increase the area of the portion of the induction coil 300 covered by the light-emitting unit 400. It will be noted that, the dashed box indicated by 531 in FIG. 1 is a region covered by the orthographic projection of the first transfer pattern 531 on the substrate 200.

In some other examples, the orthographic projection of the second electrode 420 on the substrate 200 may cover part of the orthographic projection of the first transfer pattern 531 on the substrate 200. In this case, the area of the portion of the central region AA covered by the light-emitting unit 400 is equal to a sum of an area of a portion of the central region AA covered by the second electrode 420 and an area of a portion of the central region AA covered by a portion, not overlapped with the second electrode 420, of the first transfer pattern 531; and the area of the portion of the induction coil 300 covered by the light-emitting unit 400 is equal to a sum of an area of a portion of the induction coil 300 covered by the second electrode 420 and an area of a portion of the induction coil 300 covered by the portion, not overlapped with the second electrode 420, of the first transfer pattern 531.

Alternatively, the area of the portion of the central region AA covered by the light-emitting unit 400 is equal to a sum of the area of the portion of the central region AA covered by the second electrode 420, the area of the portion of the central region AA covered by the second electrode portion, and the area of the portion of the central region AA covered by the portion, not overlapped with the second electrode 420, of the first transfer pattern 531; and the area of the portion of the induction coil 300 covered by the light-emitting unit 400 is equal to a sum of the area of the portion of the induction coil 300 covered by the second electrode 420, the area of the portion of the induction coil 300 covered by the second electrode portion, and the area of the portion of the induction coil 300 covered by the portion, not overlapped with the second electrode 420, of the first transfer pattern 531.

In some embodiments, referring to FIG. 1, the orthographic projection of the first transfer pattern 531 on the substrate 200 is located at the inner side of the orthographic projection of the induction coil 300 on the substrate 200.

Since the first transfer pattern 531 is connected to the innermost turn of conductive wiring 311 through the via hole, the orthographic projection of the first transfer pattern 531 on the substrate 200 may also cover a portion of the orthographic projection of the innermost turn of conductive wiring 311 on the substrate 200. For example, the first transfer pattern 531 is connected to the first end 320 through the via hole. In this case, the orthographic projection of the first transfer pattern 531 on the substrate 200 covers an orthographic projection of the first end 320 on the substrate 200.

Referring to FIG. 3, the second electrode 420 is connected to the first transfer pattern 531 through the via hole PDLO. Therefore, an orthographic projection of the via hole PDLO on the substrate 200 may cover part or all of the first transfer pattern 531.

A plurality of film layers of the light-emitting device 100 will be described below by considering an example in which the first electrode 410 is located at the outer side of the induction coil 300, the first electrode 410 is electrically connected to the outermost turn of conductive wiring 312, the second electrode 420 is connected to the innermost turn of conductive wiring 311, and the first transfer pattern 531 is located at the inner side of the induction coil 300.

Figure 4:
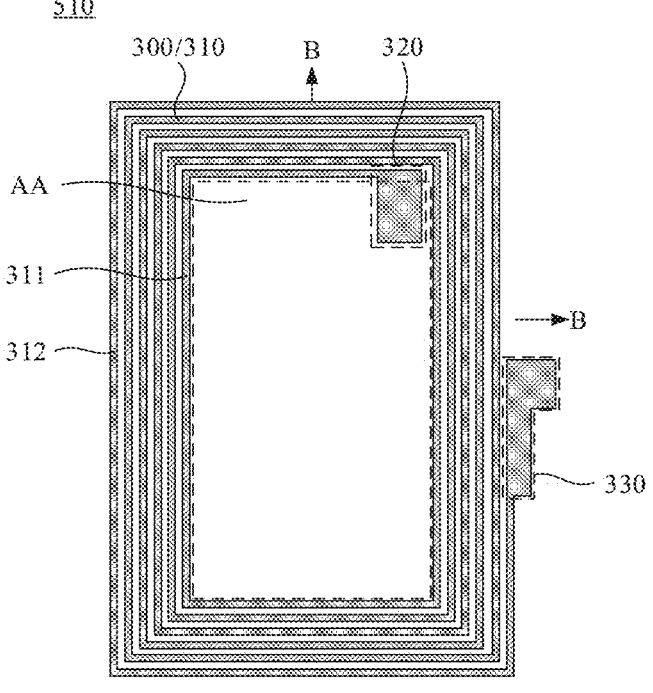
FIG. 4 is a structural diagram of a conductive layer of a light-emitting device, in accordance with some embodiments.

FIG. 4 is a structural diagram of the conductive layer 510 of the light-emitting device, in accordance with some embodiments.

Referring to FIG. 4, the induction coil 300 is included in the conductive layer 510, and the induction coil 300 may be formed by the etching process.

In some examples, a width of the first end 320 of the induction coil 300 is greater than a width of the conductive wiring 310, which can be understood that, in a width direction of the conductive wiring 310, a dimension of the first end 320 is greater than a dimension of a turn of conductive wiring 310. Referring to FIG. 4, the direction indicated by the arrow B is the width direction of the conductive wiring 310. It will be understood that, since the induction coil 300 extends around the central region AA, for the conductive wirings 310 at different positions, corresponding width directions are different.

In some examples, a width of the second end 330 of the induction coil 300 is greater than the width of the conductive wiring 310. That is, in the width direction of the conductive wiring 310, a dimension of the second end 330 is greater than a dimension of one turn of conductive wiring 310.

By increasing the width of the first end 320, it may be possible to increase a contact area between the first end 320 and the first transfer pattern 531 (which may refer to FIG. 1), thereby reducing the resistance. As a result, the current flowing through the light-emitting unit 400 is increased, and thus the luminance of the light-emitting unit 400 is improved.

Similarly, by increasing the width of the second end 330, it may be possible to increase a contact area between the second end 330 and the first electrode 410 (which may refer to FIG. 1), thereby reducing the resistance. As a result, the current flowing through the light-emitting unit 400 is increased, and thus the luminance of the light-emitting unit 400 is improved.

Figure 5:
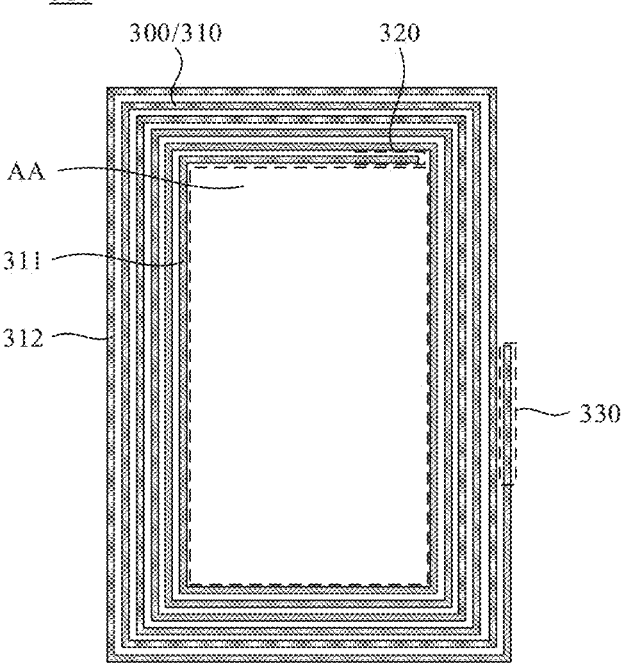
FIG. 5 is another structural diagram of a conductive layer of a light-emitting device, in accordance with some embodiments.

FIG. 5 is another structural diagram of the conductive layer 510 of the light-emitting device, in accordance with some embodiments.

Referring to FIG. 5, in some other examples, the width of the first end 320 and/or the width of the second end 330 may be equal to the width of the conductive wiring 310.

Figure 6:
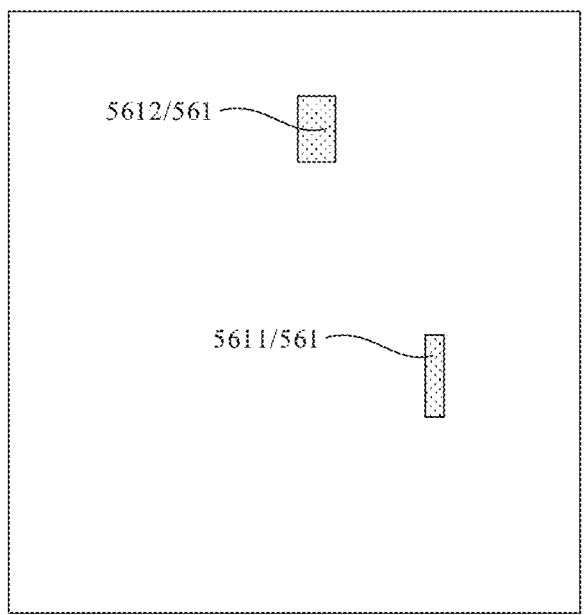
FIG. 6 is a structural diagram of an insulating layer of a light-emitting device, in accordance with some embodiments.

FIG. 6 is a structural diagram of an insulating layer 560 of the light-emitting device 100, in accordance with some embodiments.

The passivation layer PVX and the planarization layer PLN are included in the insulating layer 560. The passivation layer PVX and the planarization layer PLN are not shown in FIG. 6, but may refer to FIG. 3.

The insulating layer 560 is provided with via holes 561 therein. For example, the insulating layer 560 may be formed in following manners.

Firstly, an inorganic insulating material is deposited on the side of the conductive layer 510 away from the substrate 200 to form the passivation layer PVX.

Then, an organic insulating material is deposited on the side of the passivation layer PVX away from the substrate 200 to form the planarization layer PLN;

Next, the planarization layer PLN is etched to form via holes in the planarization layer PLN, and then the passivation layer PVX is etched through the via holes in the planarization layer PLN, thereby forming via holes in the passivation layer PVX. The via hole in the planarization layer PLN and a corresponding via hole in the passivation layer PVX together constitute the via hole 561.

The via holes 561 in the insulating layer 560 include a first-type via hole 5611 and a second-type via hole 5612. An orthographic projection of the first-type via hole 5611 on the conductive layer 510 covers the second end 330 (which may refer to FIG. 4), and an orthographic projection of the second-type via hole 5612 on the conductive layer 510 covers the first end 320 (which may refer to FIG. 4).

Figure 7:
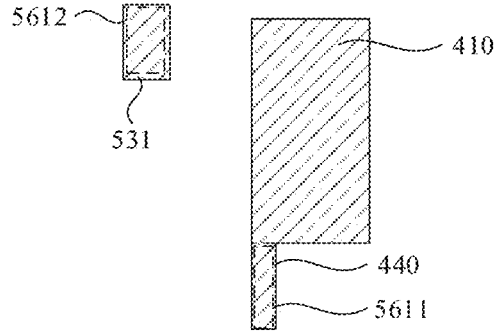
FIG. 7 is a structural diagram of a first electrode layer of a light-emitting device, in accordance with some embodiments.

FIG. 7 is a structural diagram of the first electrode layer 530 of the light-emitting device 100, in accordance with some embodiments.

Referring to FIG. 7, the first electrode 410, the connecting portion 440 and the first transfer pattern 531 are included in the first electrode layer 530. The first electrode 410 and the connecting portion 440 are connected to each other, and the connecting portion 440 is connected to the second end 330 through the first-type via hole 5611, so that the first electrode 410 may be electrically connected to the second end 330.

The first transfer pattern 531 is connected to the first end 320 through the second-type via hole 5612.

It will be noted that, the dashed boxes indicated by 5611 and 5612 in FIG. 7 are regions covered by orthographic projections of the first-type via hole 5611 and the second-type via hole 5612 on the first electrode layer 530, respectively.

Figure 8:
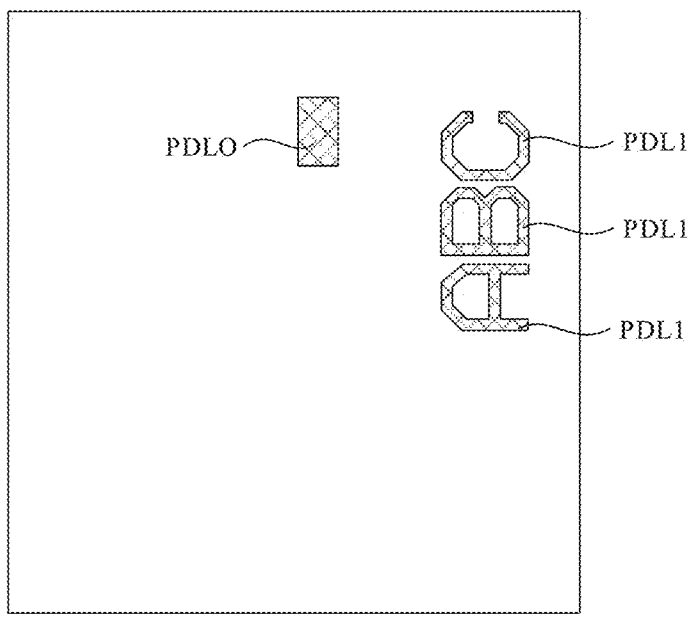
FIG. 8 is a structural diagram of a pixel defining layer of a light-emitting device, in accordance with some embodiments.

FIG. 8 is a structural diagram of the pixel defining layer PDL of the light-emitting device 100, in accordance with some embodiments.

Referring to FIG. 8, the pixel defining layer PDL is formed on the side of the first electrode layer 530 away from the substrate 200 (which may refer to FIG. 3).

The pixel openings PDL1 and the via hole PDLO are formed in the pixel defining layer PDL.

Figure 9:
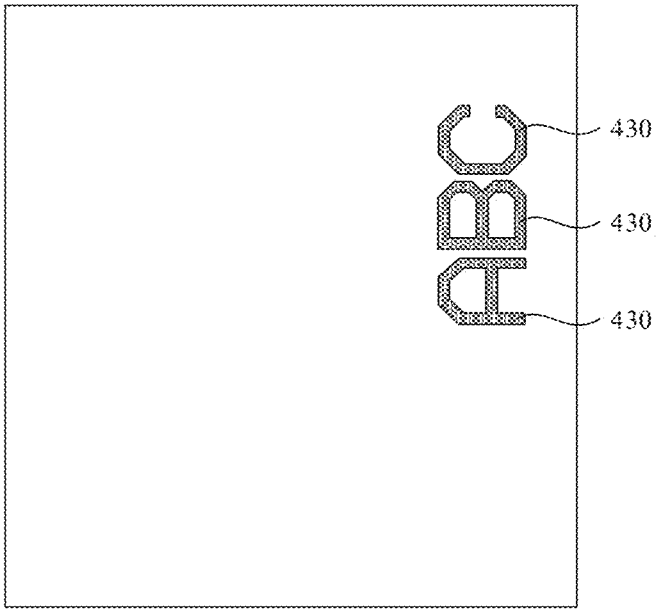
FIG. 9 is a structural diagram of a light-emitting layer of a light-emitting device, in accordance with some embodiments.

FIG. 9 is a structural diagram of the light-emitting layer EML of the light-emitting device 100, in accordance with some embodiments.

Referring to FIG. 9, the light-emitting layer EML includes at least one light-emitting portion 430. For example, three light-emitting portions 430 are shown in FIG. 9, and the three light-emitting portions 430 share the first electrode 410 and the second electrode 420. The light-emitting portions 430 are located in the pixel openings PDL1.

Figure 10:
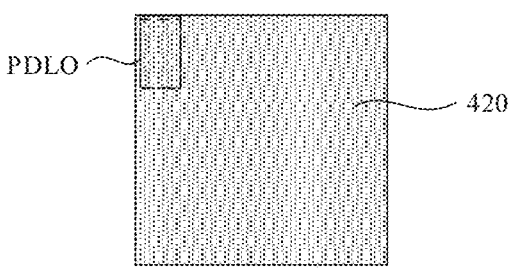
FIG. 10 is a structural diagram of a second electrode layer of a light-emitting device, in accordance with some embodiments.

FIG. 10 is a structural diagram of the second electrode layer 540 of the light-emitting device 100, in accordance with some embodiments.

Referring to FIG. 10, the second electrode 420 is included in the second electrode layer 540. The second electrode 420 is connected to the first transfer pattern 531 (which may refer to FIG. 7) through the via hole PDLO. It will be noted that, the dashed box indicated by PDLO in FIG. 10 is a region covered by the orthographic projection of the via hole PDLO on the second electrode layer 540.

The embodiments in which the first transfer pattern 531 is located at the inner side of the induction coil 300 are described above. In some other embodiments, the first transfer pattern 531 may also cover the plurality of turns of conductive wiring 310.

Figure 11:
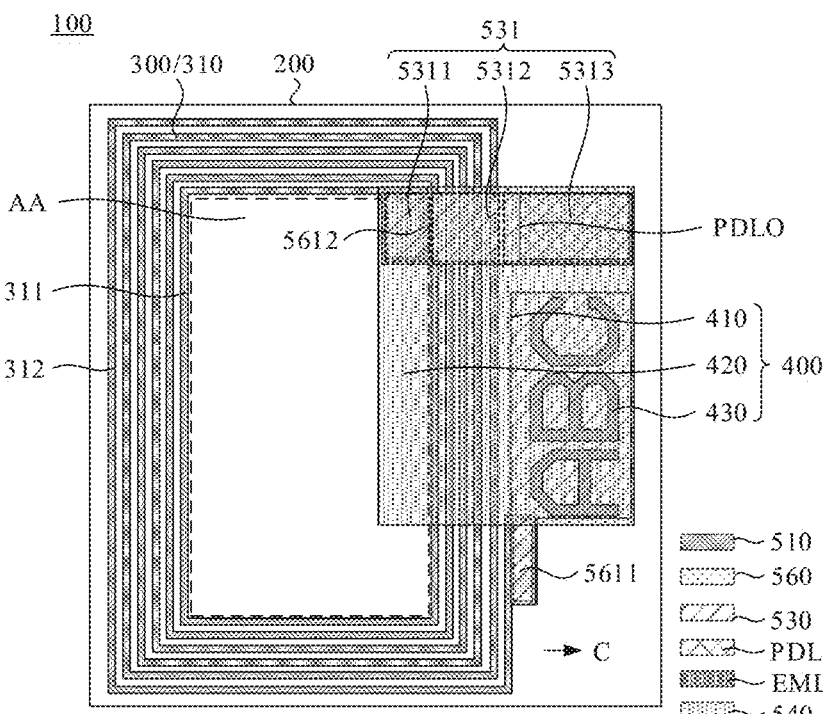
FIG. 11 is another structural diagram of a light-emitting device, in accordance with some embodiments.

FIG. 11 is another structural diagram of the light-emitting device 100, in accordance with some embodiments.

Referring to FIG. 11, the first transfer pattern 531 crosses the plurality of turns of conductive wiring 310. In this case, the first transfer pattern 531 extends from the inner side of the induction coil 300 to the outer side of the induction coil 300, and the first transfer pattern 531 crosses each turn of conductive wiring 310.

The first transfer pattern 531 includes a first portion 5311, a second portion 5312 and a third portion 5313. It will be noted that, in FIG. 11, edges of the dashed boxes indicated by 5311, 5312 and 5313 do not coincide with each other, which is only for convenience of illustrating the first portion 5311, the second portion 5312 and the third portion 5313, and the first portion 5311, the second portion 5312 and the third portion 5313 are not limited thereto.

An orthographic projection of the first portion 5311 on the substrate 200 is located at the inner side of the orthographic projection of the induction coil 300 of the substrate 200.

An orthographic projection of the second portion 5312 on the substrate 200 covers part of the orthographic projection of the plurality of turns of conductive wiring 310 on the substrate 200. It will be noted here that the orthographic projection of the second portion 5312 on the substrate 200 overlaps with an orthographic projection of a portion of each turn of conductive wiring 310 on the substrate 200.

Referring to FIG. 11, an orthographic projection of the third portion 5313 on the substrate 200 is located at the outer side of the orthographic projection of the induction coil 300 on the substrate 200.

The second electrode 420 is connected to at least one of the first portion 5311, the second portion 5312 and the third portion 5313 through a via hole.

In some examples, the second electrode 420 is connected to any two of the first portion 5311, the second portion 5312 and the third portion 5313 through via hole(s).

For example, the second electrode 420 is connected to the second portion 5312 and the third portion 5313 through a via hole. In this case, the number of via holes PDLO in the pixel defining layer PDL may be one, and the via hole PDLO may extend from the outer side of the induction coil 300 and cover the plurality of turns of conductive wiring 310. It will be noted that, in this case, the number of turns of conductive wiring 310 crossed by the via hole PDLO may be less than a maximum number of turns of the induction coil 300. Of course, it may also be possible to arrange the via hole PDLO to cross each turn of conductive wiring 310.

For example, the second electrode 420 is connected to the first portion 5311 and the third portion 5313 through the via hole(s). In this case, the number of via holes PDLO in the pixel defining layer PDL may be two, and the two via holes PDLO are located at the inner side and the outer side of the induction coil 300, respectively.

In some other examples, the second electrode 420 is connected to any one of the first portion 5311, the second portion 5312 and the third portion 5313 through a via hole.

For example, referring to FIG. 11, the second electrode 420 and the third portion 5313 are connected through the via hole PDLO. The first portion 5311 of the first transfer pattern 531 is located at the inner side of the induction coil 300, and the first portion 5311 is connected to the innermost turn of conductive wiring 311 through the second-type via hole 5612. The third portion 5313 of the first transfer pattern 531 is connected to the second electrode 420 through the via hole PDLO. Thus, the orthographic projection of the second-type via hole 5612 on the substrate 200 do not overlap with the orthographic projection of the via hole PDLO on the substrate 200. Therefore, there is no need to continuous forming holes at a position of the second-type via hole 5612 or the via hole PDLO, which ensures the reliability of the connection between the second electrode 420 and the innermost turn of conductive wiring 311, and thus improves the reliability of the light-emitting device 100.

The plurality of film layers of the light-emitting device 100 will be exemplarily described below based on the embodiments in which the second electrode 420 and the third portion 5313 are connected through the via hole.

Figure 12:
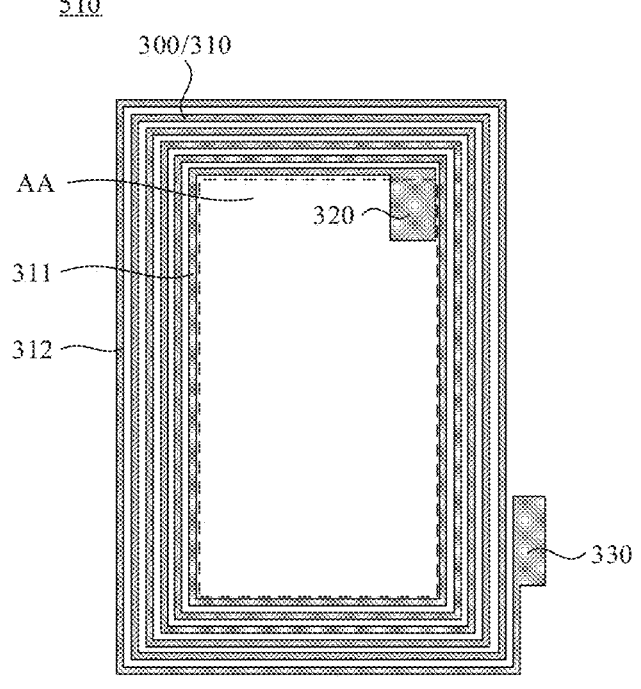
FIG. 12 is yet another structural diagram of a conductive layer of a light-emitting device, in accordance with some embodiments.

FIG. 12 is another structural diagram of the conductive layer 510 of the light-emitting device 100, in accordance with some embodiments.

Referring to FIG. 12, the induction coil 300 is included in the conductive layer 510, and the induction coil 300 includes the first end 320 and the second end 330.

Figure 13:
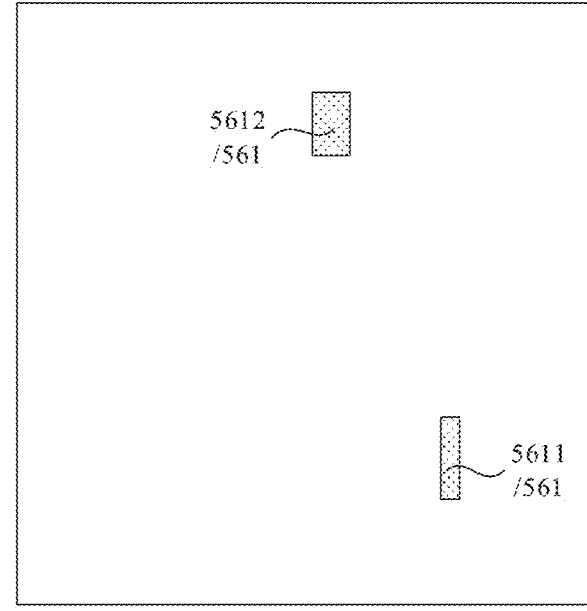
FIG. 13 is another structural diagram of an insulating layer of a light-emitting device, in accordance with some embodiments.

FIG. 13 is another structural diagram of the insulating layer 560 of the light-emitting device 100, in accordance with some embodiments.

Referring to FIG. 13, the via holes 561 are formed in the insulating layer 560. The via holes 561 in the insulating layer 560 include the first-type via hole 5611 and the second-type via hole 5612.

Figure 14:
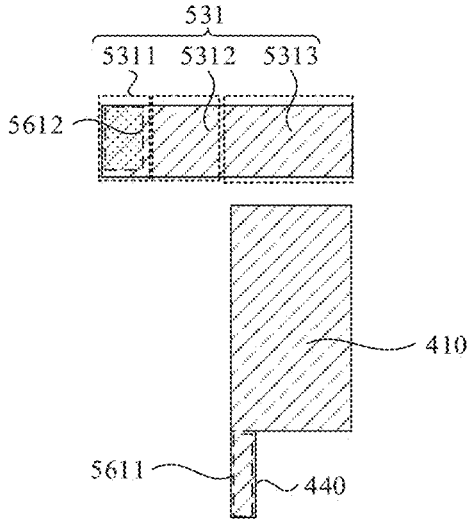
FIG. 14 is another structural diagram of a first electrode layer of a light-emitting device, in accordance with some embodiments.

FIG. 14 is another structural diagram of the first electrode layer 530 of the light-emitting device 100, in accordance with some embodiments.

Referring to FIG. 14, the first electrode 410, the first transfer pattern 531 and the connecting portion 440 are included in the first electrode layer 530. The first electrode 410 and the connecting portion 440 are connected to each other, and the connecting portion 440 is connected to the second end 330 (as shown in FIG. 12) through the first-type via hole 5611; the first transfer pattern 531 is connected to the first end 320 (as shown in FIG. 12) through the second-type via hole 5612.

It will be noted that the dashed boxes indicated by 5611 and 5612 in FIG. 14 are regions covered by orthographic projections of the first-type via hole 5611 and the second-type via hole 5612 on the first electrode layer 530, respectively.

Figure 15:
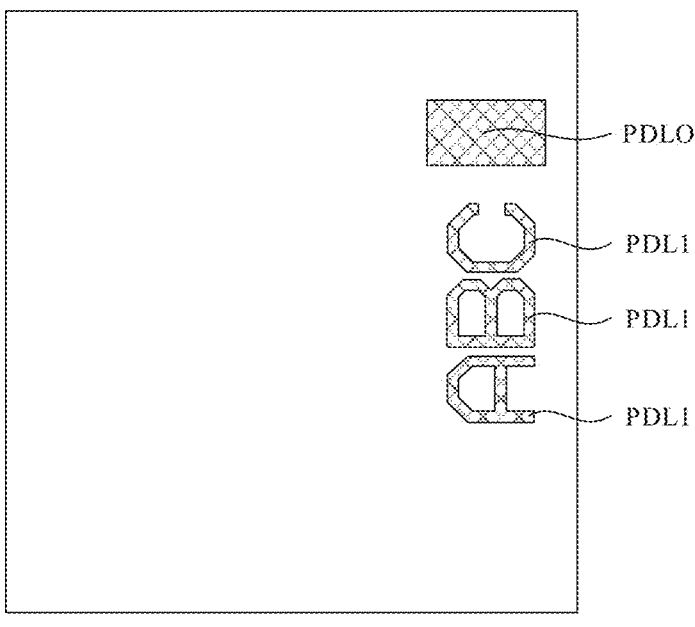
FIG. 15 is another structural diagram of a pixel defining layer of a light-emitting device, in accordance with some embodiments.

FIG. 15 is another structural diagram of the pixel defining layer PDL of the light-emitting device 100, in accordance with some embodiments.

Referring to FIG. 15, the pixel openings PDL1 and the via hole PDLO are formed in the pixel defining layer PDL.

Figure 16:
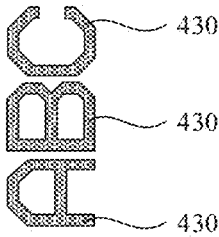
FIG. 16 is another structural diagram of a light-emitting layer of a light-emitting device, in accordance with some embodiments.

FIG. 16 is another structural diagram of the light-emitting layer EML of the light-emitting device 100, in accordance with some embodiments.

Referring to FIG. 16, the light-emitting layer EML includes at least one light-emitting portion 430. For example, three light-emitting portions 430 are shown in FIG. 16, and the three light-emitting portions 430 share the first electrode 410 and the second electrode 420. The light-emitting portions 430 are located in the pixel openings PDL1 (as shown in FIG. 15).

Figure 17:
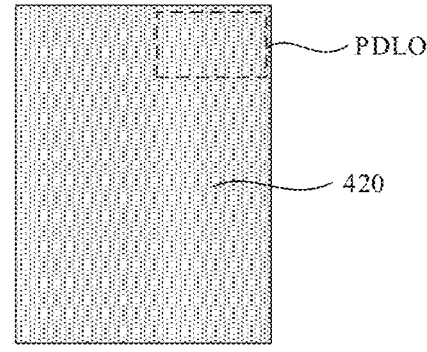
FIG. 17 is another structural diagram of a second electrode layer of a light-emitting device, in accordance with some embodiments.

FIG. 17 is another structural diagram of the second electrode layer 540 of the light-emitting device 100, in accordance with some embodiments.

Referring to FIG. 17, the second electrode 420 is included in the second electrode layer 540. The second electrode 420 is connected to the third portion 5313 (which may refer to FIG. 14) of the first transfer pattern 531 through the via hole PDLO. It will be noted that, the dashed box indicated by PDLO in FIG. 17 is a region covered by the orthographic projection of the via hole PDLO on the second electrode layer 540.

Figures 18, 19:
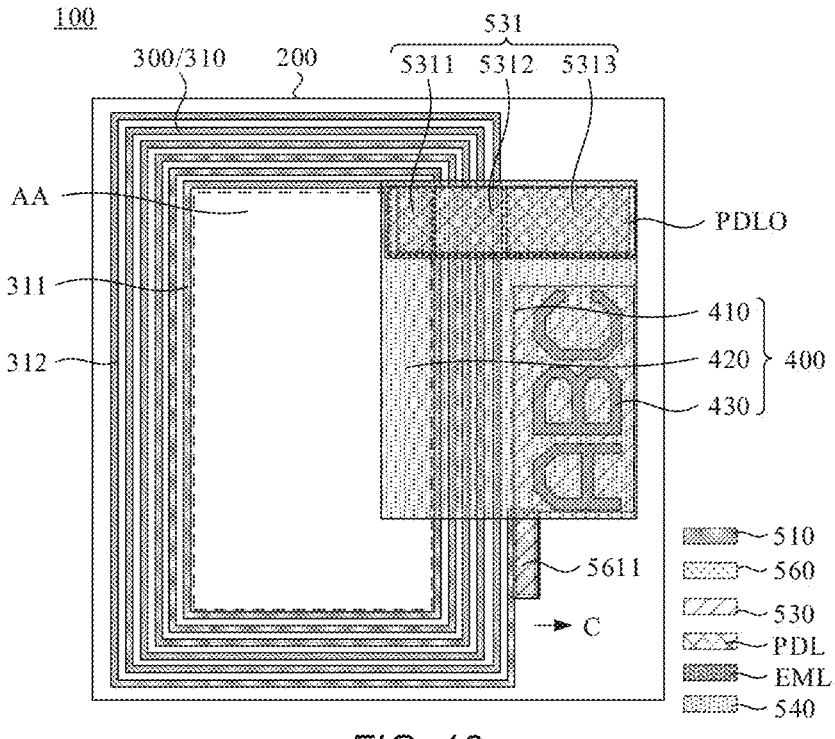
FIG. 18 is yet another structural diagram of a light-emitting device, in accordance with some embodiments.
FIG. 19 is yet another structural diagram of a light-emitting device, in accordance with some embodiments.

The embodiments in which the second electrode 420 and the third portion 5313 are connected through the via hole are described above. In some other embodiments, referring to FIG. 18, the second electrode 420 is connected to the first portion 5311, the second portion 5312 and the third portion 5313 through a via hole. In this case, the via hole PDLO in the pixel defining layer PDL crosses each turn of conductive wiring 310. FIG. 18 is another structural diagram of the light-emitting device 100, in accordance with some embodiments.

Referring to FIGS. 11 and 18, in some examples, the third portion 5313 and the first electrode 410 are sequentially arranged along the outermost turn of conductive wiring 312 in the induction coil 300, which may reduce dimensions of the first electrode 410 and the third portion 5313 in a first direction C. As a result, a distance between the outermost turn of conductive wiring 312 and an edge of the light-emitting device 100 may be reduced, which helps reduce the area of the light-emitting device 100. As shown in FIGS. 11 and 18, a direction directed from the inner side of to the outer side of the induction coil 300 is the first direction C, and the direction indicated by the arrow C is the first direction C. It will be understood that, since the induction coil 300 is disposed around the central region AA, in a case where the third portion 5313 and the first electrode 410 are disposed at different positions, the first direction C is different.

In the embodiments described above, one or more light-emitting units may share the first electrode 410. In some other embodiments, in a case where multiple light-emitting units 400 are provided, part of the light-emitting units 400 may each have an independent first electrode 410.

FIG. 19 is yet another structural diagram of the light-emitting device 100, in accordance with some embodiments.

Referring to FIG. 19, in some embodiments, the multiple light-emitting units 400 are provided. First electrodes 410 of at least two light-emitting units 400 are arranged at intervals, and areas of orthographic projections, on the substrate 200, of the first electrodes 410 of the at least two light-emitting units 400 are different. The at least two light-emitting units 400 share a second electrode 420 of a light-emitting unit 400 in the at least two light-emitting units 400.

For convenience of description, "the area of the orthographic projection, on the substrate 200, of the first electrode 410 of the light-emitting unit 400" is simply referred to as the area of the first electrode 410 of the light-emitting unit 400.

In the case where the second electrode 420 is shared by at least two light-emitting units 400 having different areas, second electrodes 420 of the light-emitting units 400 sharing the second electrode 420 have a same potential. In addition, the first electrodes 410 of the at least two light-emitting units 400 are all connected to the innermost turn of conductive wiring 311, and thus, the first electrodes 410 of the at least two light-emitting units 400 have a same potential. Therefore, a potential difference between the first electrode 410 and the second electrode 420 of each of the at least two light-emitting units 400 is the same.

Since the areas of the first electrodes 410 are different, the resistances of the first electrodes 410 are different. As a result, the resistances of the at least two light-emitting units 400 are different. In the case where the potential difference between the first electrode 410 and the second electrode 420 of each of the at least two light-emitting units 400 is the same, currents flowing through the at least two light-emitting units 400 are different, so that the luminance of the at least two light-emitting units 400 is different. As a result, the light-emitting device 100 may have different display effects.

In some examples, the light-emitting units 400 whose first electrodes 410 have different areas may be arranged along a specific direction in such a manner that the areas of the first electrodes 410 gradually decrease, so that an image displayed by the light-emitting device 100 may have gradually changed brightness. Of course, the light-emitting units 400 may be arranged according to other specified rules, so that the light-emitting device 100 has other display effects.

In some examples, an area of a first electrode 410 of each light-emitting unit 400 is different, so that the luminance of each light-emitting unit 400 is different.

Of course, in some other embodiments, the multiple light-emitting units 400 may be divided into multiple types. First electrodes 410 of light-emitting units 400 of different types have different areas. The number of light-emitting units 400 of each type may be one or more. The multiple types of light-emitting units 400 may share the second electrode 420.

Referring to FIG. 19, first electrode 410 of the multiple types of light-emitting units 400 may be located at the outer side of the induction coil 300. In this case, the second electrode 420 shared by the multiple types of light-emitting units 400 may cross the plurality of turns of conductive wiring 310 and be connected to the innermost turn of conductive wiring 311 through a via hole.

In some embodiments, referring to FIG. 19, the at least two light-emitting units 400 further share a connecting portion 440, and the connecting portion 440 is disposed in the same layer as the first electrodes 410 of the at least two light-emitting units 400. The first electrodes 410 of the at least two light-emitting units 400 are electrically connected to the induction coil 300 through the connection portion 440. It will be understood that, "the at least two light-emitting units 400" here refers to the at least two light-emitting units 400 whose first electrodes 410 have different areas, and may also refer to the multiple types of light-emitting units 400 mentioned above. In this case, the multiple types of light-emitting units 400 share the connecting portion 440.

In some examples, the connecting portion 440 is connected to the innermost turn of conductive wiring 311 in the induction coil 300 through a via hole, and the connecting portion 440 is also connected first electrodes 410 of the multiple types of light-emitting units 400, so that the first electrodes 410 of the multiple types of light-emitting units 400 may be electrically connected to the innermost turn of conductive wiring 311 through the connecting portion 440.

In some other examples, referring to FIG. 19, the connecting portion 440 may be connected to the outermost turn of conductive wiring 312 in the induction coil 300 through a via hole. For example, the connecting portion 440 is connected to the second end 330 through the via hole.

The connecting portion 440 will be described in combination with a structural diagram of the plurality of film layers of the light-emitting device 100.

It will be firstly noted that structures of the conductive layer 510, the insulating layer 560, the pixel defining layer PDL, the light-emitting layer EML, and the second electrode layer 540 may refer to FIGS. 4, 6, 8, 9 and 10 in sequence.

Figure 20:
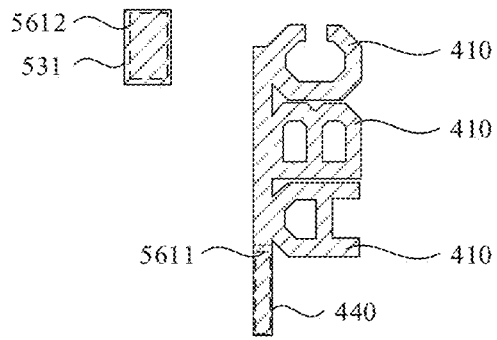
FIG. 20 is yet another structural diagram of a first electrode layer of a light-emitting device, in accordance with some embodiments.

FIG. 20 is yet another structural diagram of the first electrode layer 530 of the light-emitting device 100, in accordance with some embodiments.

Referring to FIG. 20, the first transfer pattern 531, the connecting portion 440 and the first electrodes 410 are included in the first electrode layer 530. The first transfer pattern 531 is located at the inner side of the induction coil 300. The induction coil 300 is not shown in FIG. 20, but may refer to FIG. 19.

The first transfer pattern 531 may be connected to the first end 320 (which may refer to FIG. 4) through the second-type via hole 5612.

The connecting portion 440 is connected to the first electrodes 410, and the connecting portion 440 is connected to the second end 330 (which may refer to FIG. 4) through the first-type via hole 5611, so that the first electrodes 410 are electrically connected to the second end 330.

It will be noted that, the dashed boxes indicated by 5611 and 5612 in FIG. 20 are regions covered by orthographic projections of the first-type via hole 5611 and the second-type via hole 5612 on the first electrode layer 530, respectively.

The embodiments in which the first electrode 410 is located at the outer side of the induction coil 300, and the second electrode 420 crosses the plurality of turns of conductive wiring 310 and is connected to the innermost turn of conductive wiring 311 are described above. In some other embodiments, the second electrode 420 may also be located at the outer side of the induction coil 300.

Figure 21A:
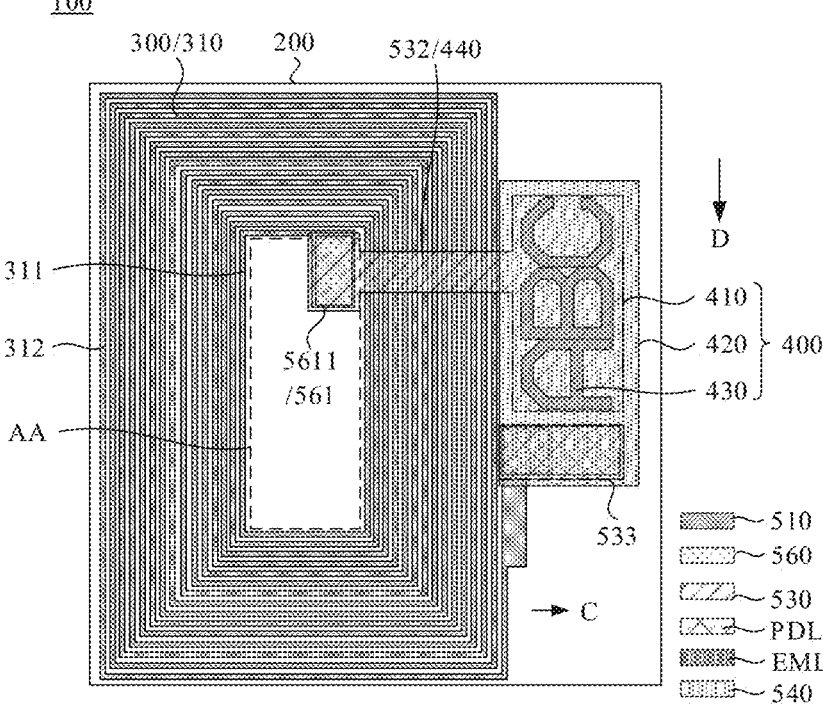
FIG. 21A is yet another structural diagram of a light-emitting device, in accordance with some embodiments.

FIG. 21A is yet another structural diagram of the light-emitting device 100, in accordance with some embodiments.

Referring to FIG. 21A, the orthographic projection of the second electrode 420 on the substrate 200 is substantially located at the outer side of the orthographic projection of the induction coil 300 on the substrate 200. That is, the second electrode 420 is substantially located at the outer side of the induction coil 300. The second electrode 420 being substantially located at the outer side of the induction coil 300 can be understood that, an area of the second electrode 420 located at the outer side of the induction coil 300 is greater than or equal to 90% of an area of the second electrode 420. In some examples, the second electrode 420 may be entirely located the outer side of the induction coil 300. In some other examples, a portion of the second electrode 420 is located at the outer side of the induction coil 300, and another portion of the second electrode 420 may cover one or more turns of conductive wiring 310 of the induction coil 300 close to the outer side of induction coil 300.

The second electrode 420 is located on the side of the first electrode 410 away from the substrate 200. Thus, the distance between the first electrode 410 and the induction coil 300 is relatively small.

The light-emitting unit 400 further includes a first bridging pattern 532, and the first bridging pattern 532 is disposed in the same layer as the first electrode 410. An end of the first bridging pattern 532 is connected to the innermost turn of conductive wiring 311 through a via hole, and another end of the first bridging pattern 532 crosses the plurality of turns of conductive wiring 310 and is connected to the first electrode 410, so that the first electrode 410 may be electrically connected to the innermost turn of conductive wiring 311. The second electrode 420 is connected to the outermost turn of conductive wiring 312.

It will be firstly noted that, in the case where the light-emitting unit 400 further includes the first bridging pattern 532, the region covered by the orthographic projection of the light-emitting unit 400 on the substrate 200 includes regions covered by orthographic projections of the first electrode 410, the second electrode 420, the light-emitting portion(s) 430 and the first bridging pattern 532 of the light-emitting unit 400 on the substrate 200.

The first bridging pattern 532 is disposed in the same layer as the first electrode 410, and thus the first bridging pattern 532 is made of a same material as the first electrode 410. A resistance of the first electrode 410 is less than a resistance of the second electrode 420. Therefore, by arranging the first bridging pattern 532 and the first electrode 410 to be in the same layer, it may be possible to make the first bridging pattern 532 have a relatively small resistance, thereby increasing the current flowing through the first bridging pattern 532. As a result, the current flowing through the light-emitting unit 400 is increased, and thus the luminance of the light-emitting unit 400 is improved.

The first bridging pattern 532 may serve as the connecting portion 440.

Since the first electrode 410 is located at the outer side of the induction coil 300, and the second electrode 420 is substantially located at the outer side of the induction coil 300, only a portion of the first bridging pattern 532 is located at the inner side of the induction coil 300. That is, the central region AA is covered by only the portion of the first bridging pattern 532. Thus, an area of the portion of the central region AA being covered is relatively small, which may increase the magnetic flux of the induction coil 300, and increase the induced electromotive force in the induction coil 300. As a result, the induced current on the induction coil 300 is increased, and thus the luminance of the light-emitting unit 400 is improved.

In addition, in the case where the second electrode 420 is substantially located at the outer side of the induction coil 300, in the at least one light-emitting unit 400, only the portion of the first bridging pattern 532 may cover the induction coil 300, or the portion of the first bridging pattern 532 and a portion of the second electrode 420 that is less than 10% of the second electrode 420 may cover the induction coil 300. Therefore, the area of the portion of the induction coil 300 covered by the light-emitting unit 400 is relatively small, which may increase the area of the induction coil 300 for cutting the magnetic induction lines, and thus increase the induced electromotive force in the induction coil 300. As a result, the induced current on the induction coil 300 is increased, and thus the luminance of the light-emitting unit 400 is improved.

As shown in FIG. 21A, in some examples, the first electrode 410 and a second transfer pattern 533 are sequentially arranged along the outermost turn of conductive wiring 312 in the induction coil 300, so that dimensions of the first electrode 410 and the second transfer pattern 533 in the first direction C may be reduced. As shown in FIG. 21A, the direction directed from the inner side of to the outer side of the induction coil 300 is the first direction C, and the direction indicated by the arrow C is the first direction C. Since the dimensions of the first electrode 410 and the second transfer pattern 533 in the first direction C may be reduced, the distance between the outermost turn of conductive wiring 312 and the edge of the light-emitting device 100 may be reduced, which helps reduce the area of the light-emitting device 100. It will be noted that, the dashed box indicated by 533 in FIG. 21A is a region where the second transfer pattern 533 is located.

Figure 21B:
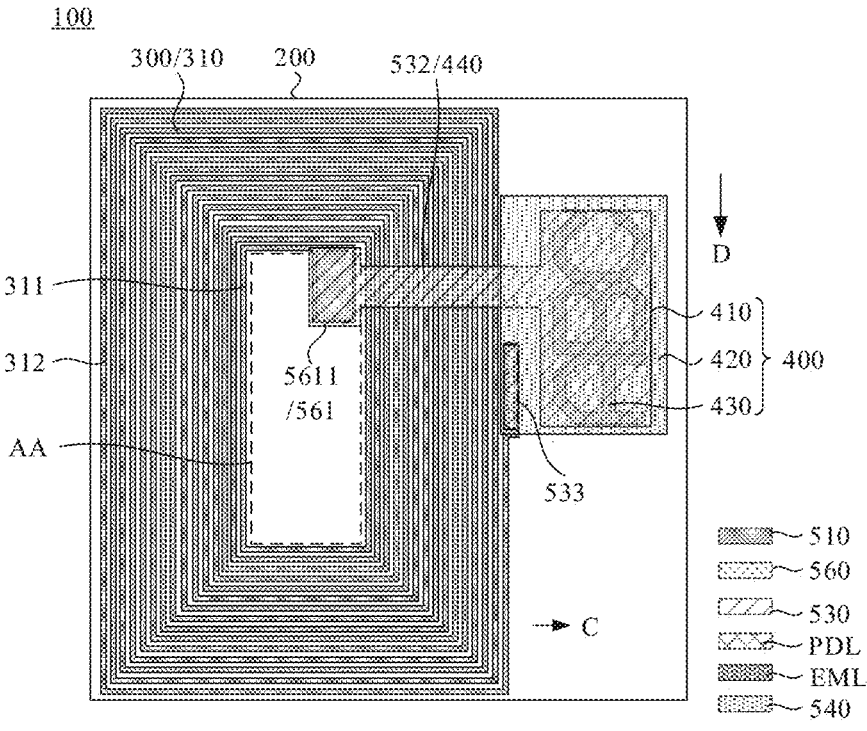
FIG. 21B is yet another structural diagram of a light-emitting device, in accordance with some embodiments.

As shown in FIG. 21B, in some other examples, the second transfer pattern 533 is located at a side of the first electrode 410 proximate to the induction coil 300. It will be noted that, the dashed box indicated by 533 in FIG. 21B is a region where the second transfer pattern 533 is located.

Referring to FIGS. 21A and 21B, in some embodiments, the first bridging pattern 532 and the first electrode 410 are sequentially arranged along the first direction C. In a second direction D, a width of the first bridging pattern 532 is less than a width of the first electrode 410. Referring to FIG. 21A, the direction indicated by the arrow D is the second direction D. The second direction D is perpendicular to the first direction C, and the second direction D is parallel to the substrate 200 (i.e., perpendicular to the thickness direction of the substrate 200). Therefore, an area of a portion of the induction coil 300 covered by the first bridging pattern 532 may be reduced, and thus the area of the induction coil 300 for cutting the magnetic induction lines may be increased and the induced electromotive force in the induction coil 300 may be increased. As a result, the induced current on the induction coil 300 may be increased, and thus the luminance of the light-emitting unit 400 may be improved.

In addition, in some examples, in the second direction D, the width of the first bridging pattern 532 is less than a width of the second electrode 420.

The plurality of film layers of the light-emitting device 100 will be described below by considering an example in which the first electrode 410 is located at the outer side of the induction coil 300, the second electrode 420 is substantially located at the outer side of the induction coil 300, and the first bridging pattern 532 is connected to the first electrode 410.

Figure 22:
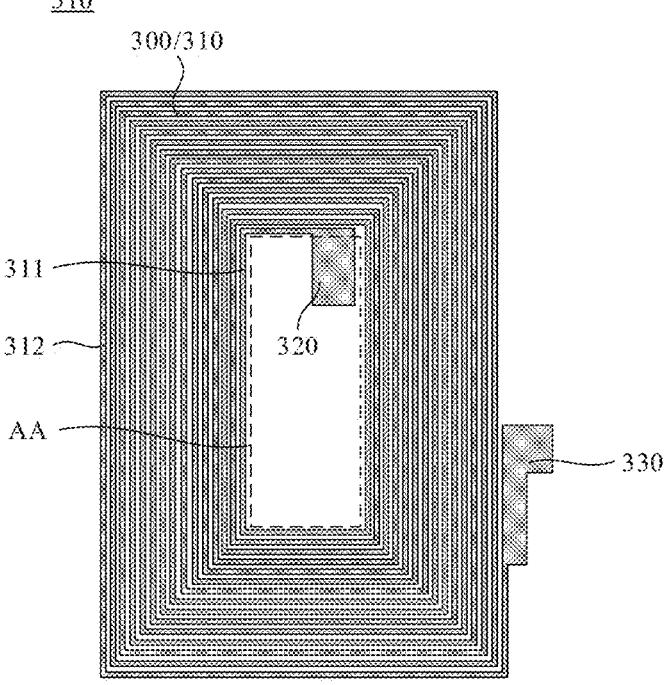
FIG. 22 is yet another structural diagram of a conductive layer of a light-emitting device, in accordance with some embodiments.

FIG. 22 is yet another structural diagram of the conductive layer 510 of the light-emitting device 100, in accordance with some embodiments.

Referring to FIG. 22, the induction coil 300 is included in the conductive layer 510, and the induction coil 300 includes the first end 320 and the second end 330.

Figure 23:
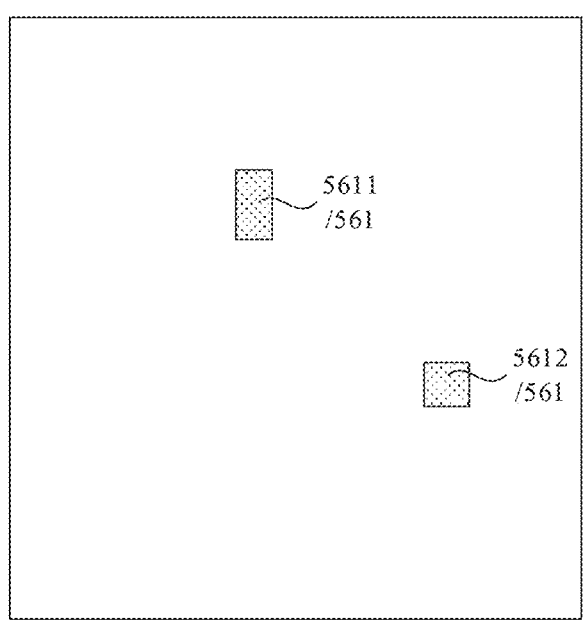
FIG. 23 is yet another structural diagram of an insulating layer of a light-emitting device, in accordance with some embodiments.

FIG. 23 is yet another structural diagram of the first insulating layer 560 of the light-emitting device 100, in accordance with some embodiments.

Referring to FIG. 23, the via holes 561 in the insulating layer 560 include the first-type via hole 5611 and the second-type via hole 5612. The first-type via hole 5611 is located at the inner side of the induction coil 300, and the second-type via hole 5612 is located at the outer side of the induction coil 300. The induction coil 300 is not shown in FIG. 23, but may refer to FIG. 21A.

Figure 24:
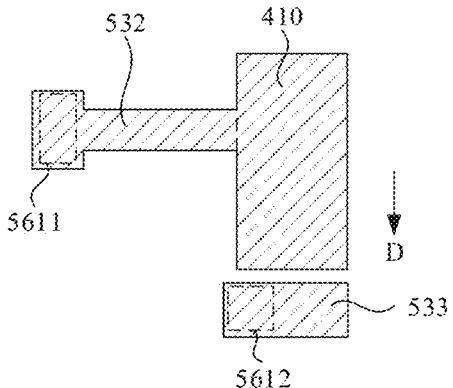
FIG. 24 is yet another structural diagram of a first electrode layer of a light-emitting device, in accordance with some embodiments.

FIG. 24 is yet another structural diagram of the first electrode layer 530 of the light-emitting device 100, in accordance with some embodiments.

Referring to FIG. 24, the first electrode 410, the first bridging pattern 532 and the second transfer pattern 533 are included in the first electrode layer 530. The first bridging pattern 532 is connected to the first end 320 (as shown in FIG. 22) through the first-type via hole 5611, so that the first electrode 410 is electrically connected to the first end 320.

The second transfer pattern 533 is connected to the second end 330 (as shown in FIG. 22) through the second-type via hole 5612.

It will be noted that, the dashed boxes indicated by 5611 and 5612 in FIG. 24 are regions covered by orthographic projections of the first-type via hole 5611 and the second-type via hole 5612 on the first electrode layer 530, respectively.

Figure 25:
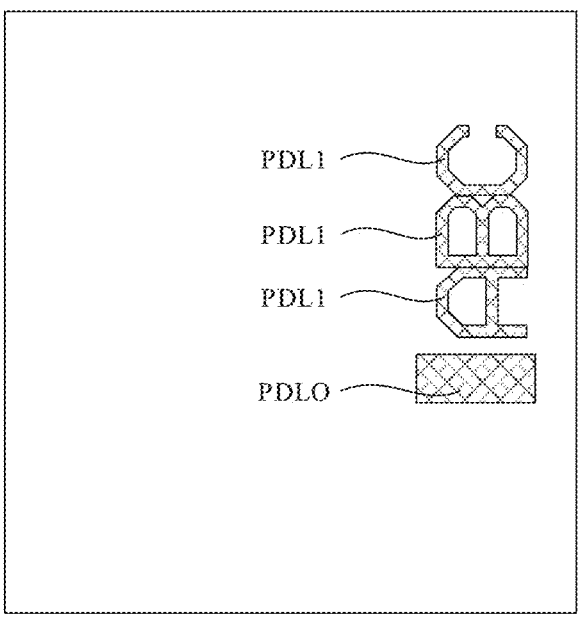
FIG. 25 is yet another structural diagram of a pixel defining layer of a light-emitting device, in accordance with some embodiments.

FIG. 25 is yet another structural diagram of the pixel defining layer PDL of the light-emitting device 100, in accordance with some embodiments.

Referring to FIG. 25, the pixel openings PDL1 and the via hole PDLO are formed in the pixel defining layer PDL.

Figure 26:
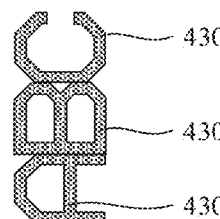
FIG. 26 is yet another structural diagram of a light-emitting layer of a light-emitting device, in accordance with some embodiments.

FIG. 26 is yet another structural diagram of the light-emitting layer EML of the light-emitting device 100, in accordance with some embodiments.

Referring to FIG. 26, the light-emitting layer EML includes at least one light-emitting portion 430. For example, three light-emitting portions 430 are shown in FIG. 26, and the three light-emitting portions 430 share the first electrode 410 and the second electrode 420. The three light-emitting portions 430 are located in the three pixel openings PDL1.

Figure 27:
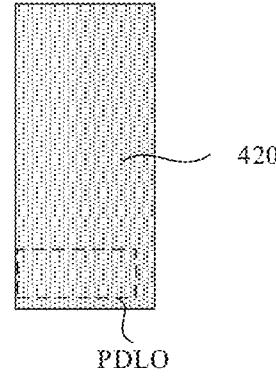
FIG. 27 is yet another structural diagram of a second electrode layer of a light-emitting device, in accordance with some embodiments.

FIG. 27 is yet another structural diagram of the second electrode layer 540 of the light-emitting device 100, in accordance with some embodiments.

Referring to FIG. 27, the second electrode 420 is included in the second electrode layer 540. The second electrode 420 is connected to the second transfer pattern 533 (which may refer to FIG. 24) through the via hole PDLO, and the second transfer pattern 533 is connected to the second end 330 (which may refer to FIG. 22), so that the second electrode 420 is electrically connected to the second end 330. It will be noted that, the dashed box indicated by PDLO in FIG. 27 is a region covered by the orthographic projection of the via hole PDLO on the second electrode layer 540.

The embodiments in which the first electrode 410 is located at the outer side of the induction coil 300, the second electrode 420 is substantially located the outer side of the induction coil 300, and the first bridging pattern 532 is connected to the first electrode 410 are described above. In some other embodiments, the first bridging pattern 532 may also be connected to the second electrode 420.

Figure 28:
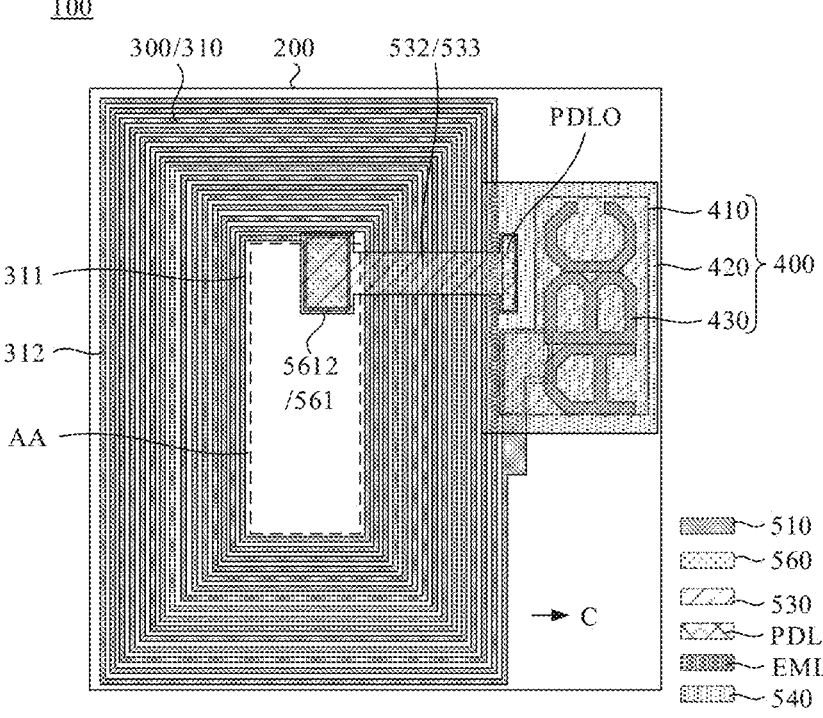
FIG. 28 is yet another structural diagram of a light-emitting device, in accordance with some embodiments.

FIG. 28 is yet another structural diagram of the light-emitting device 100, in accordance with some embodiments.

Referring to FIG. 28, an end of the first bridging pattern 532 is connected to the innermost turn of conductive wiring 311 through a via hole, and another end of the first bridging pattern 532 crosses the plurality of turns of conductive wiring 310 and is connected to the second electrode 420 through another via hole, so that the second electrode 420 may be electrically connected to the innermost turn of conductive wiring 311. The first electrode 410 is connected to the outermost turn of conductive wiring 312.

In this case, the first bridging pattern 532 may serve as the second transfer pattern 533. The second electrode 420 may be connected to the first bridging pattern 532 through the via hole PDLO in the pixel defining layer PDL.

In some examples, referring to FIG. 28, an orthographic projection of the first electrode 410 on the substrate 200 is located at a side, away from the orthographic projection of the induction coil 300 on the substrate 200, of the orthographic projection of the via hole PDLO on the substrate 200. That is, a distance between the orthographic projection of the first electrode 410 on the substrate 200 and the orthographic projection of the induction coil 300 on the substrate 200 is greater than a distance between the orthographic projection of the via hole PDLO on the substrate 200 and the orthographic projection of the induction coil 300 on the substrate 200.

In some other embodiments, the orthographic projection of the first electrode 410 on the substrate 200 and the orthographic projection of the via hole PDLO on the substrate 200 may be sequentially arranged along the edge of the outermost turn of conductive wiring 312.

The plurality of film layers of the light-emitting device 100 will be described below by considering an example in which the first bridging pattern 532 is connected to the second electrode 420 through the via hole, and the first electrode 410 is connected to the outermost turn of conductive wiring 312.

Figure 29:
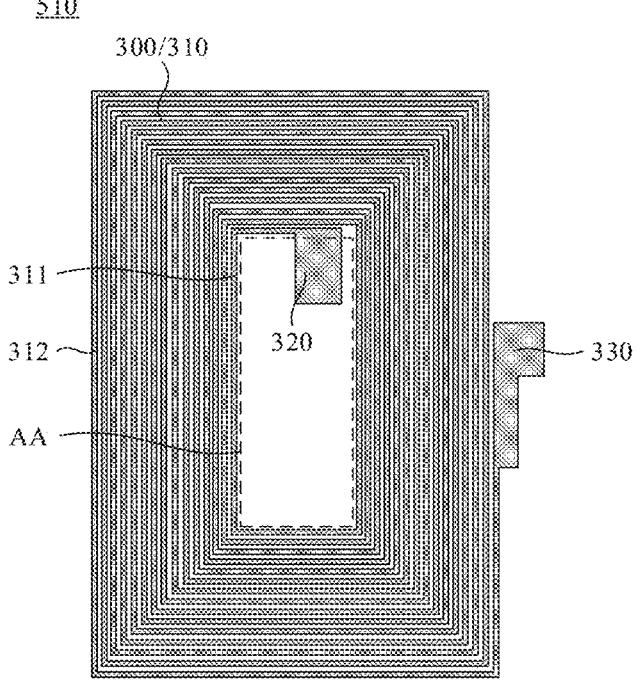
FIG. 29 is yet another structural diagram of a conductive layer of a light-emitting device, in accordance with some embodiments.

FIG. 29 is yet another structural diagram of the conductive layer 510 of the light-emitting device 100, in accordance with some embodiments.

Referring to FIG. 29, the induction coil 300 is included in the conductive layer 510, and the induction coil 300 includes the first end 320 and the second end 330.

Figure 30:
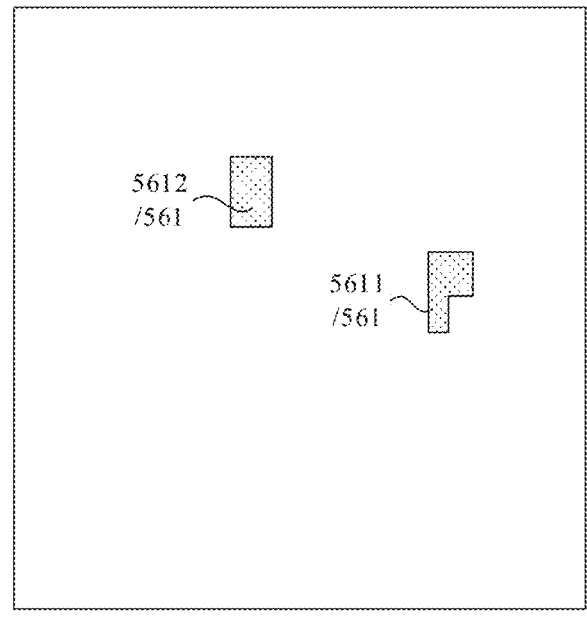
FIG. 30 is yet another structural diagram of an insulating layer of a light-emitting device, in accordance with some embodiments.

FIG. 30 is yet another structural diagram of the first insulating layer 560 of the light-emitting device 100, in accordance with some embodiments.

Referring to FIG. 30, the via holes 561 in the insulating layer 560 include the first-type via hole 5611 and the second-type via hole 5612. The first-type via hole 5611 overlaps with the second end 330 in the direction perpendicular to the substrate 200, and the second-type via hole 5612 overlaps with the first end 320 in the direction perpendicular to the substrate 200. The first end 320 and the second end 330 are not shown in FIG. 30, but may refer to FIG. 29.

Figure 31:
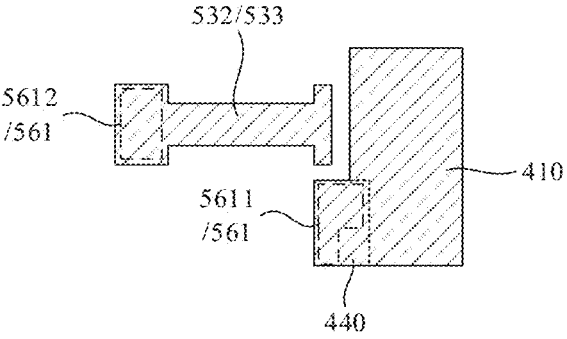
FIG. 31 is yet another structural diagram of a first electrode layer of a light-emitting device, in accordance with some embodiments.

FIG. 31 is yet another structural diagram of the first electrode layer 530 of the light-emitting device 100, in accordance with some embodiments.

Referring to FIG. 31, the first electrode 410, the connecting portion 440 and the first bridging pattern 532 are included in the first electrode layer 530. An end of the first bridging pattern 532 away from the first electrode 410 is connected to the first end 320 (as shown in FIG. 29) through the second-type via hole 5612. The first electrode 410 and the connecting portion 440 are connected to each other, and the connecting portion 440 is connected to the second end 330 (shown in FIG. 29) through the first-type via hole 5611. It will be noted that, the dashed boxes indicated by 5611 and 5612 in FIG. 31 are regions covered by orthographic projections of the first-type via hole 5611 and the second-type via hole 5612 on the first electrode layer 530, respectively.

Figure 32:
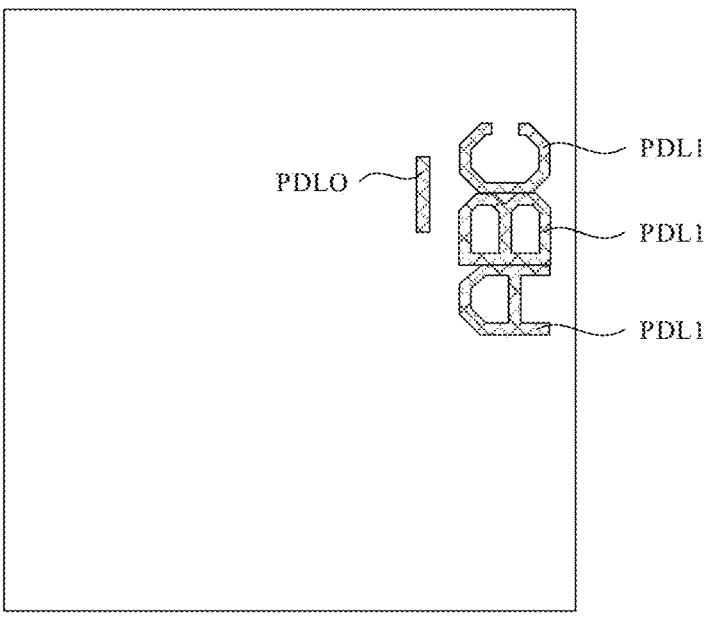
FIG. 32 is yet another structural diagram of a pixel defining layer of a light-emitting device, in accordance with some embodiments.

FIG. 32 is yet another structural diagram of the pixel defining layer PDL of the light-emitting device 100, in accordance with some embodiments.

Referring to FIG. 32, the pixel openings PDL1 and the via hole PDLO are formed in the pixel defining layer PDL.

Figure 33:
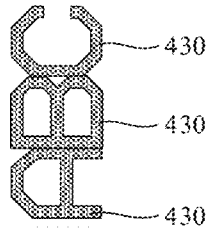
FIG. 33 is yet another structural diagram of a light-emitting layer of a light-emitting device, in accordance with some embodiments.

FIG. 33 is yet another structural diagram of the light-emitting layer EML of the light-emitting device 100, in accordance with some embodiments.

Referring to FIG. 33, the light-emitting layer EML includes at least one light-emitting portion 430. For example, three light-emitting portions 430 are shown in FIG. 33, and the three light-emitting portions 430 share the first electrode 410 and the second electrode 420. The light-emitting portions 430 are located in the pixel openings PDL1.

Figure 34:
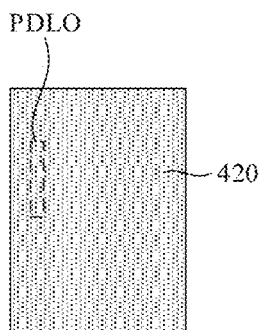
FIG. 34 is yet another structural diagram of a second electrode layer of a light-emitting device, in accordance with some embodiments.

FIG. 34 is yet another structural diagram of the second electrode layer 540 of the light-emitting device 100, in accordance with some embodiments.

Referring to FIG. 34, the second electrode 420 is included in the second electrode layer 540. The second electrode 420 is connected to the first bridging pattern 532 (which may refer to FIG. 31) through the via hole PDLO, and the first bridging pattern 532 is connected to the first end 320 (which may refer to FIG. 29), so that the second electrode 420 is electrically connected to the first end 320. The dashed box indicated by PDLO in FIG. 34 is a region covered by the orthographic projection of the via hole PDLO on the second electrode layer 540.

In the case where the first electrode 410 is located at the outer side of the induction coil 300, and the second electrode 420 is substantially located at the outer side of the induction coil 300, the number of light-emitting units 400 may also be multiple. First electrodes 410 of at least two light-emitting units 400 are disposed at intervals, and areas of orthographic projections, on the substrate 200, of the first electrodes 410 of the at least two light-emitting units 400 are different. The at least two light-emitting units 400 share the second electrode 420.

The case where the orthographic projection of the first electrode 410 on the substrate 200 is located at the outer side of the orthographic projection of the induction coil 300 on the substrate 200 is described in the embodiments above. In some other embodiments, the orthographic projection of the first electrode 410 on the substrate 200 may also be located at the inner side of the orthographic projection of the induction coil 300 on the substrate 200. For convenience of description, a description that "the orthographic projection of the first electrode 410 on the substrate 200 may be located at the inner side of the orthographic projection of the induction coil 300 on the substrate 200" is simply referred to as the first electrode 410 being located at the inner side of the induction coil 300.

Figure 35:
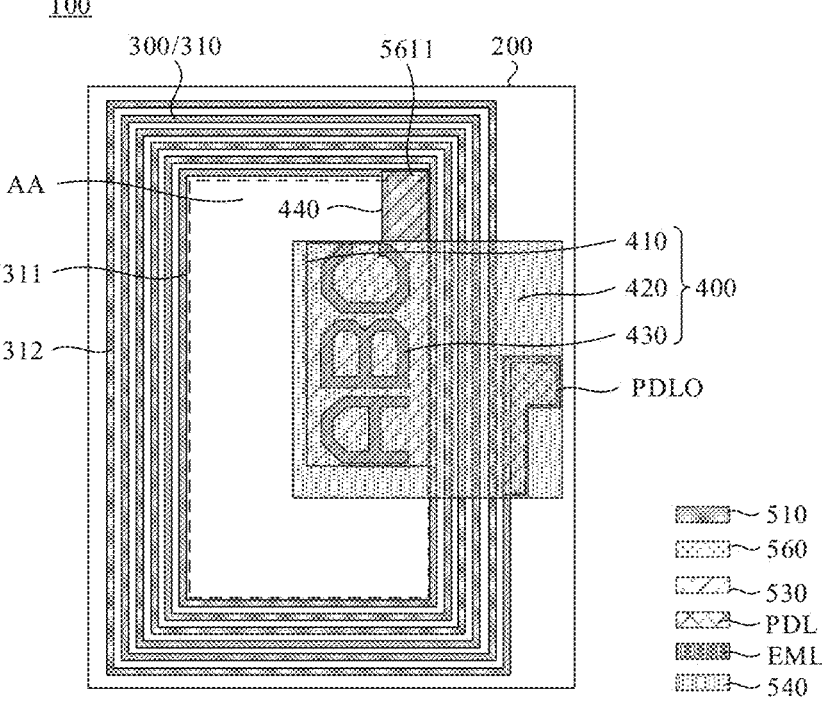
FIG. 35 is yet another structural diagram of a light-emitting device, in accordance with some embodiments.

FIG. 35 is yet another structural diagram of the light-emitting device 100, in accordance with some embodiments.

Referring to FIG. 35, the first electrode 410 is located at the inner side of the induction coil 300 and is electrically connected to the innermost turn of conductive wiring 311. The orthographic projection of the second electrode 420 on the substrate 200 covers at least part of the orthographic projection of the first electrode 410 on the substrate 200, and the second electrode 420 crosses the plurality of turns of conductive wiring 310 and is connected to the outermost turn of conductive wiring 312.

Tests are performed by using two induction coils 300 with a same specification, and the same specification means that the two induction coils 300 have the same shape and size. For the same specification, it can also be understood that the two induction coils 300 have the same inner diameter, the same outer diameter, the same line width, and the same number of turns.

It have been found through tests that, when the first electrode 410 is located at the inner side of the induction coil 300, and in the case where the first electrode 410 is electrically connected to the innermost turn of conductive wiring 311, and the second electrode 420 is electrically connected to the outermost turn of conductive wiring 312, the induced voltage across two ends of the induction coil 300 is 3.36 V. When the first electrode 410 is located at the inner side of the induction coil 300, and in the case where the first electrode 410 is electrically connected to the outermost turn of conductive wiring 312, and the second electrode 420 is electrically connected to the innermost turn of conductive wiring 311, the induced voltage across the induction coil 300 is 3.28 V. The higher the induced voltage across the two ends of the induction coil 300 is, the higher the luminance of the light-emitting unit 400 is. Therefore, when the first electrode 410 is located at the inner side of the induction coil 300, and in the case where the first electrode 410 is electrically connected to the innermost turn of conductive wiring 311, and the second electrode 420 is connected to the outermost turn of conductive wiring 312, the light-emitting unit 400 has a relatively high luminance.

In this case, the luminance of the light-emitting unit 400 is relatively high.

In this case, the first electrode 410 and the body portion of the second electrode 420 are all arranged at the inner side of the induction coil 300, which may reduce an area of a portion of the light-emitting unit 400 located at the outer side of the induction coil 300, thereby reducing the area of the light-emitting device 100.

Figure 36:
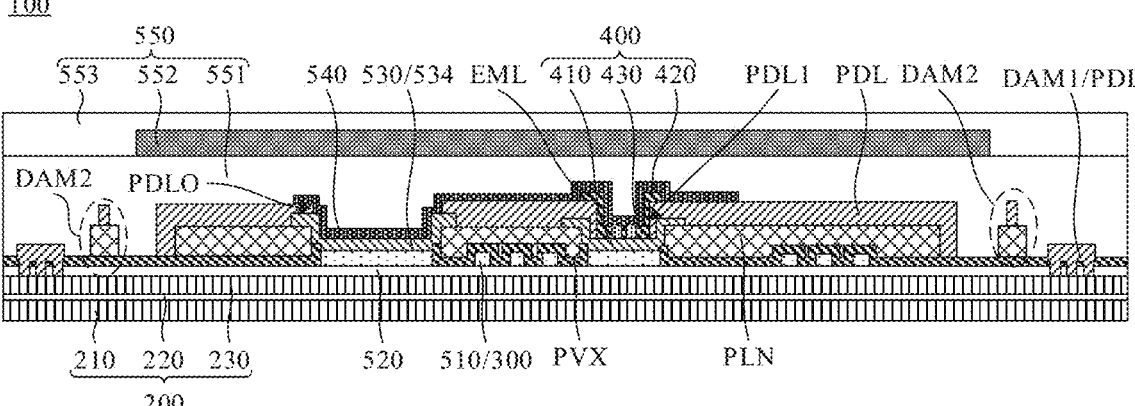
FIG. 36 is another sectional view of a light-emitting device, in accordance with some embodiments.

FIG. 36 is another sectional view of the light-emitting device 100, in accordance with some embodiments.

Referring to FIG. 36, the second electrode 420 is located on the side of the first electrode 410 away from the substrate 200. The light-emitting unit 400 further includes a third transfer pattern 534, and the third transfer pattern 534 is disposed in the same layer as the first electrode 410. The second electrode 420 is connected to the third transfer pattern 534 through a via hole, and the third transfer pattern 534 is connected to the outermost turn of conductive wiring 312 (as shown in FIG. 35) through another via hole.

For example, the third transfer pattern 534 is connected to the second end 330 through the another via hole.

The second electrode 420 is connected to the outermost turn of conductive wiring 312 (as shown in FIG. 35) through the third transfer pattern 534, which may avoid that a via hole is directly arranged between the second electrode 420 and the outermost turn of conductive wiring 312, resulting in the via hole being excessively deep and the resistance being increased.

The plurality of film layers of the light-emitting device 100 will be described based on the embodiments in which the first electrode 410 is located at the inner side of the induction coil 300.

Figure 37:
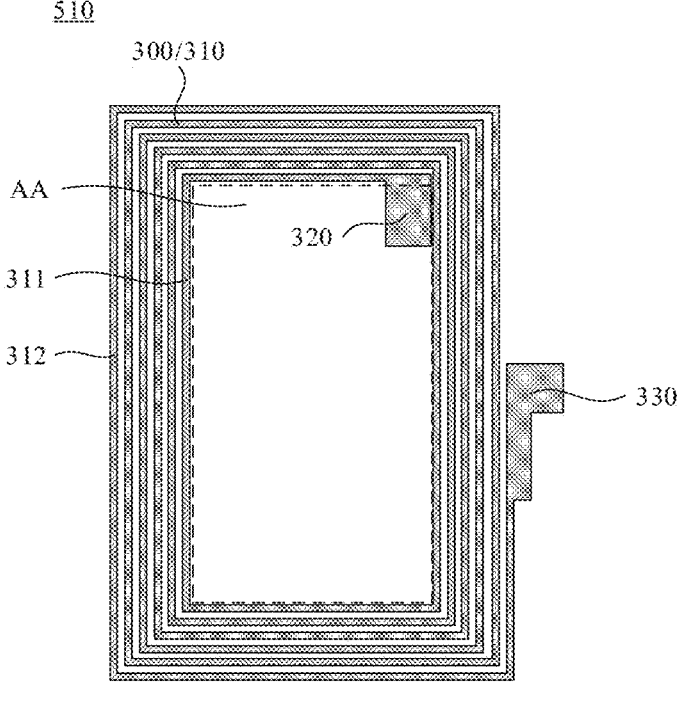
FIG. 37 is yet another structural diagram of a conductive layer of a light-emitting device, in accordance with some embodiments.

FIG. 37 is yet another structural diagram of the conductive layer 510 of the light-emitting device 100, in accordance with some embodiments.

Referring to FIG. 37, the induction coil 300 is included in the conductive layer 510, and the induction coil 300 includes the first end 320 and the second end 330.

Figure 38:
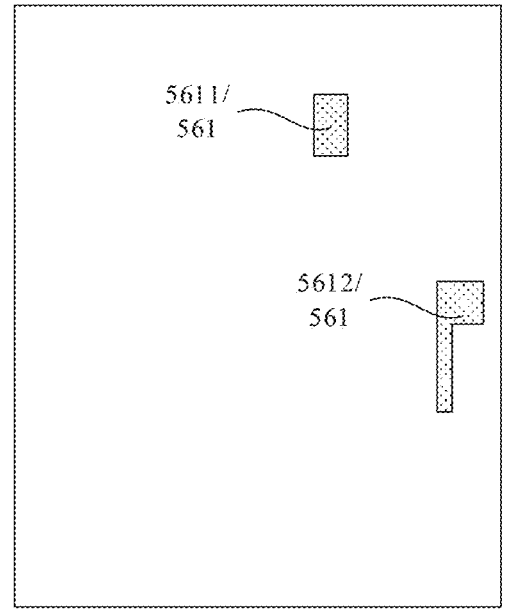
FIG. 38 is yet another structural diagram of an insulating layer of a light-emitting device, in accordance with some embodiments.

FIG. 38 is yet another structural diagram of the insulating layer 560 of the light-emitting device 100, in accordance with some embodiments.

Referring to FIG. 38, the via holes 561 in the insulating layer 560 include the first-type via hole 5611 and the second-type via hole 5612. The first-type via hole 5611 is located at the inner side of the induction coil 300, and the second-type via hole 5612 is located at the outer side of the induction coil 300. The induction coil 300 is not shown in FIG. 38, but may refer to FIG. 37.

The orthographic projection of the first-type via hole 5611 on the substrate 200 overlaps with the orthographic projection of the first end 320 (which may refer to FIG. 37) on the substrate 200.

The orthographic projection of the second-type via hole 5612 on the first substrate 200 overlaps with the orthographic projection of the second end 330 (which may refer to FIG. 37) on the substrate 200.

Figure 39:
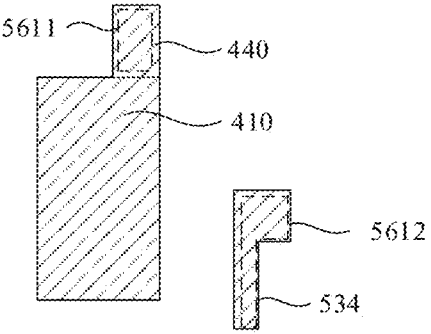
FIG. 39 is yet another structural diagram of a first electrode layer of a light-emitting device, in accordance with some embodiments.

FIG. 39 is yet another structural diagram of the first electrode layer 530 of the light-emitting device 100, in accordance with some embodiments.

Referring to FIG. 39, the first electrode 410, the connecting portion 440 and the third transfer pattern 534 are included in the first electrode layer 530. The first electrode 410 is connected to the connecting portion 440, and the connecting portion 440 is connected to the first end 320 (as shown in FIG. 37) through the first-type via hole 5611, so that the first electrode 410 is electrically connected to the first end 320.

The third transfer pattern 534 is connected to the second end 330 through the second-type via hole 5612.

It will be noted that, the dashed boxes indicated by 5611 and 5612 in FIG. 39 are regions covered by orthographic projections of the first-type via hole 5611 and the second-type via hole 5612 on the first electrode layer 530, respectively.

Figure 40:
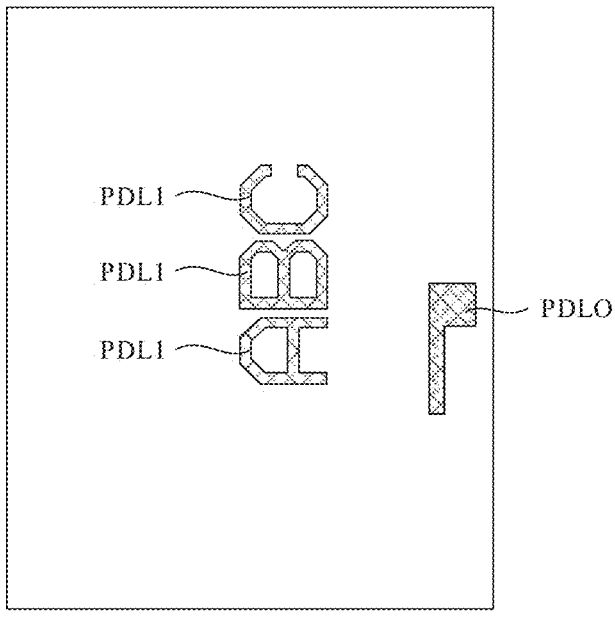
FIG. 40 is yet another structural diagram of a pixel defining layer of a light-emitting device, in accordance with some embodiments.

FIG. 40 is yet another structural diagram of the pixel defining layer PDL of the light-emitting device 100, in accordance with some embodiments.

Referring to FIG. 40, the pixel openings PDL1 and the via hole PDLO are formed in the pixel defining layer PDL.

Figure 41:
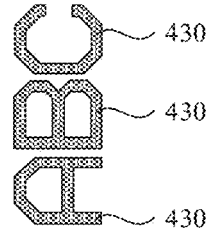
FIG. 41 is yet another structural diagram of a light-emitting layer of a light-emitting device, in accordance with some embodiments.

FIG. 41 is yet another structural diagram of the light-emitting layer EML of the light-emitting device 100, in accordance with some embodiments.

Referring to FIG. 41, the light-emitting layer EML includes at least one light-emitting portion 430. For example, three light-emitting portions 430 are shown in FIG. 41, and the three light-emitting portions 430 share the first electrode 410 and the second electrode 420. The light-emitting portions 430 are located in the pixel openings PDL1.

Figure 42:
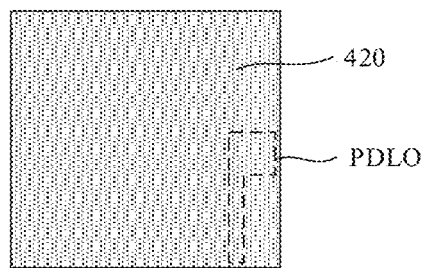
FIG. 42 is yet another structural diagram of a second electrode layer of a light-emitting device, in accordance with some embodiments.

FIG. 42 is yet another structural diagram of the second electrode layer 540 of the light-emitting device 100, in accordance with some embodiments.

Referring to FIG. 42, the second electrode 420 is included in the second electrode layer 540. The second electrode 420 is connected to the third transfer pattern 534 (which may refer to FIG. 39) through the via hole PDLO, and the third transfer pattern 534 is connected to the second end 330 (which may refer to FIG. 37), so that the second electrode 420 is electrically connected to the second end 330. It will be noted that the dashed box indicated by PDLO in FIG. 42 is the orthographic projection of the via hole PDLO on the second electrode layer 540.

Figure 43:
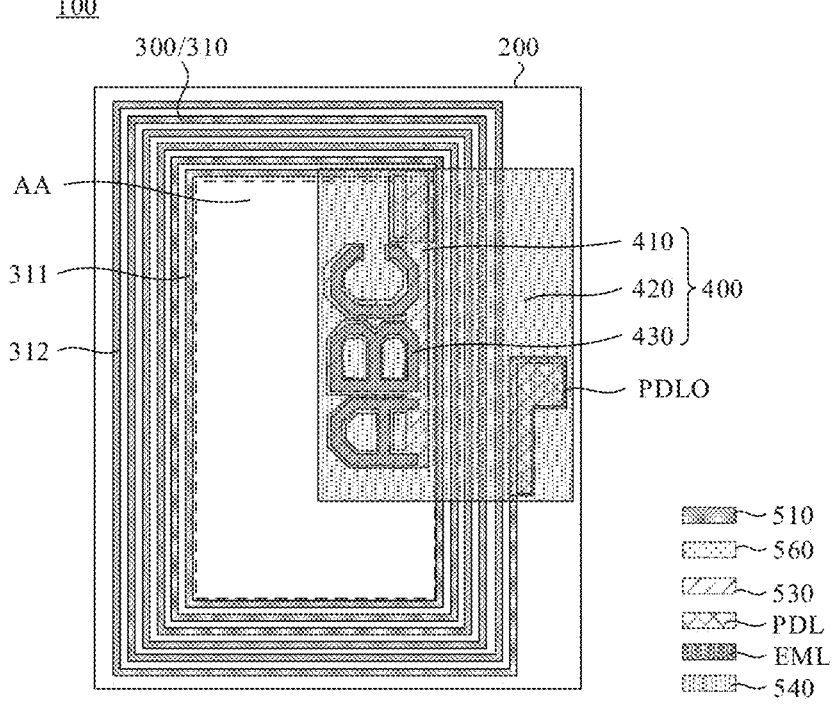
FIG. 43 is yet another structural diagram of a light-emitting device, in accordance with some embodiments.

FIG. 43 is yet another structural diagram of the light-emitting device 100, in accordance with some embodiments.

Referring to FIG. 43, in the case where the first electrode 410 is located at the inner side of the induction coil 300, the number of the light-emitting units 400 may be multiple. First electrodes 410 of at least two light-emitting units 400 are disposed at intervals, and areas of orthographic projections, on the substrate 200, of the first electrodes 410 of the at least two light-emitting units 400 are different. The at least two light-emitting units 400 share the second electrode 420, so that the light-emitting units 400 whose first electrodes 410 have different areas can have different luminance.

Figure 44:
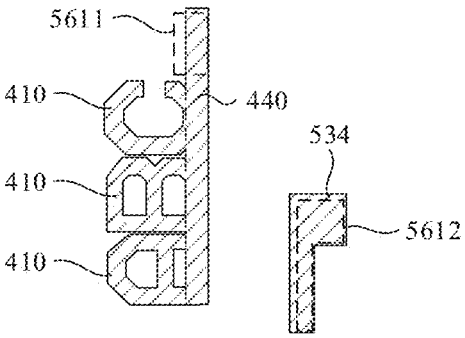
FIG. 44 is yet another structural diagram of a first electrode layer of a light-emitting device, in accordance with some embodiments.

FIG. 44 is yet another structural diagram of the first electrode layer 530 of the light-emitting device 100, in accordance with some embodiments. In addition, structures of the conductive layer 510, the insulating layer 560, the pixel defining layer PDL, the light-emitting layer EML, and the second electrode layer 540 may be referred to FIGS. 37, 38, 40, 41 and 42 in sequence.

Referring to FIG. 44, the third transfer pattern 534, the connecting portion 440, and the first electrodes 410 are included in the first electrode layer 530. The third transfer pattern 534 is located at the outer side of the induction coil 300, and the connecting portion 440 and the first electrodes 410 are located at the inner side of the induction coil 300. The induction coil 300 is not shown in FIG. 44, but may refer to FIG. 43.

For example, the connecting portion 440 is connected to the innermost turn of conductive wiring 311 through a via hole. For example, the connecting portion 440 and the first end 320 are connected through the first-type via hole 5611. The innermost turn of conductive wiring 311 and the first end 320 may refer to FIG. 37 again.

For example, the third transfer pattern 534 may be connected to the second end 330 through the second-type via hole 5612 (as shown in FIG. 37).

In the case where the first electrode 410 is located at the inner side of the induction coil 300 and is electrically connected to the innermost turn of conductive wiring 311, and the second electrode 420 is electrically connected to the outermost turn of conductive wiring 312, the second electrode 420 may cross the plurality of turns of conductive wiring 310 to be connected to the outermost turn of conductive wiring 312; or the second electrode 420 may also be located at only the inner side of the induction coil 300.

Figure 45A:
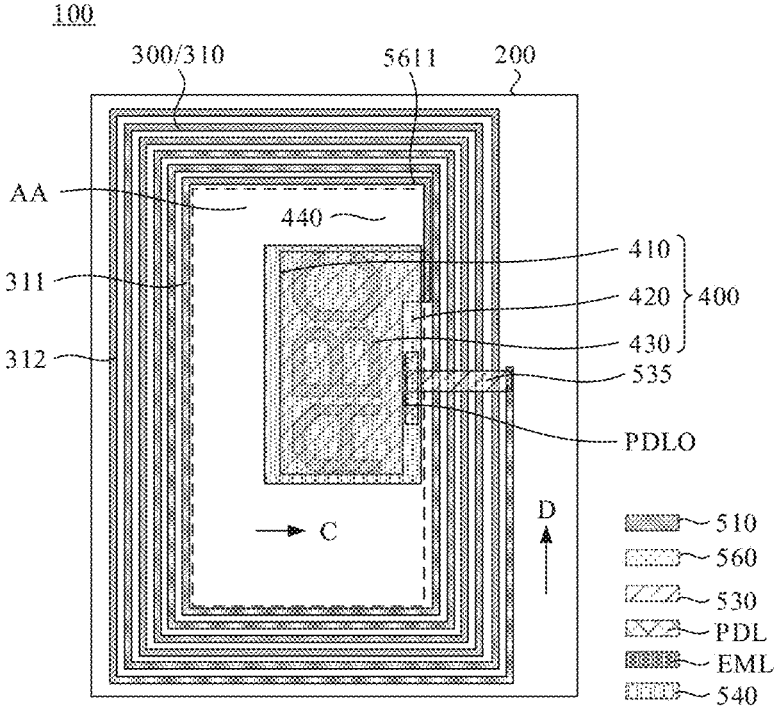
FIG. 45A is yet another structural diagram of a light-emitting device, in accordance with some embodiments.

FIG. 45A is yet another structural diagram of the light-emitting device 100, in accordance with some embodiments.

Referring to FIG. 45A, the orthographic projection of the first electrode 410 on the substrate 200 and the orthographic projection of the second electrode 420 on the substrate 200 are both located at the inner side of the orthographic projection of the induction coil 300 on the substrate 200. That is, the first electrode 410 and the second electrode 420 are both located at the inner side of the induction coil 300. The first electrode 410 is electrically connected to the innermost turn of conductive wiring 311.

Figure 45B:
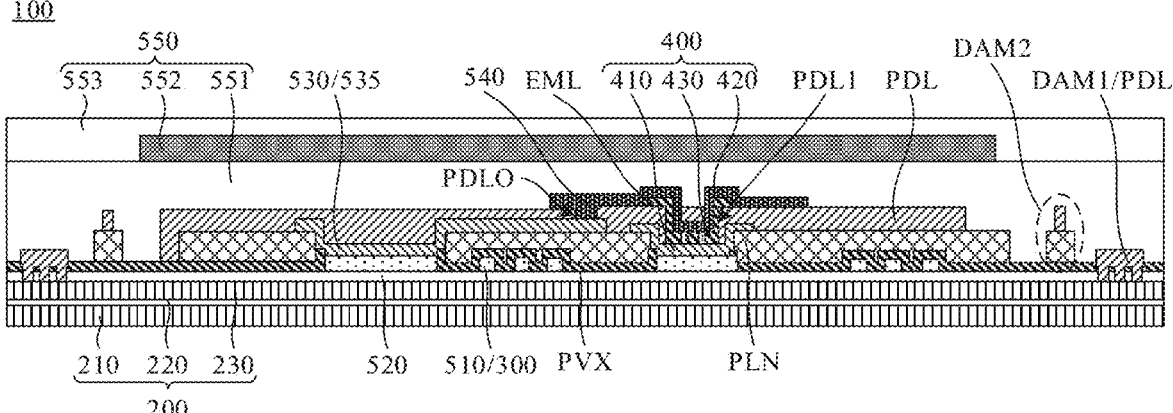
FIG. 45B is yet another sectional view of a light-emitting device, in accordance with some embodiments.

FIG. 45B is yet another sectional view of the light-emitting device 100, in accordance with some embodiments.

Referring to FIG. 45B, the second electrode 420 is located at the side of the first electrode 410 away from the substrate 200.

Referring to FIG. 45A, the light-emitting unit 400 further includes a second bridging pattern 535, and the second bridging pattern 535 is disposed in the same layer as the first electrode 410.

An end of the second bridging pattern 535 is connected to the outermost turn of conductive wiring 312 through a via hole, and another end of the second bridging pattern 535 crosses the plurality of turns of conductive wiring 310 and is connected to the second electrode 420 through another via hole, so that the second electrode 420 is electrically connected to the outermost turn of conductive wiring 312.

The via hole PDLO is formed in the pixel defining layer PDL, and the second electrode 420 is connected to the second bridging pattern 535 through the via hole PDLO.

Referring to FIG. 45A, the first electrode 410 and the second bridging patterns 535 are sequentially arranged along the first direction C. In the second direction D, a width of the second bridging pattern 535 is less than the width of the first electrode 410. Referring to FIG. 45A, the direction indicated by the arrow D is the second direction D. The second direction D is perpendicular to the first direction C, and the second direction D is parallel to the substrate 200. Therefore, an area of a portion of the induction coil 300 covered by the second bridging pattern 535 may be reduced, and thus the area of the induction coil 300 for cutting the magnetic induction lines may be increased, the induced electromotive force in the induction coil 300 may be increased, and the induced current on the induction coil 300 may be increased. As a result, and the luminance of the light-emitting unit 400 may be improved.

In addition, in some examples, in the second direction D, the width of the second bridging pattern 535 is less than the width of the second electrode 420.

Figure 46:
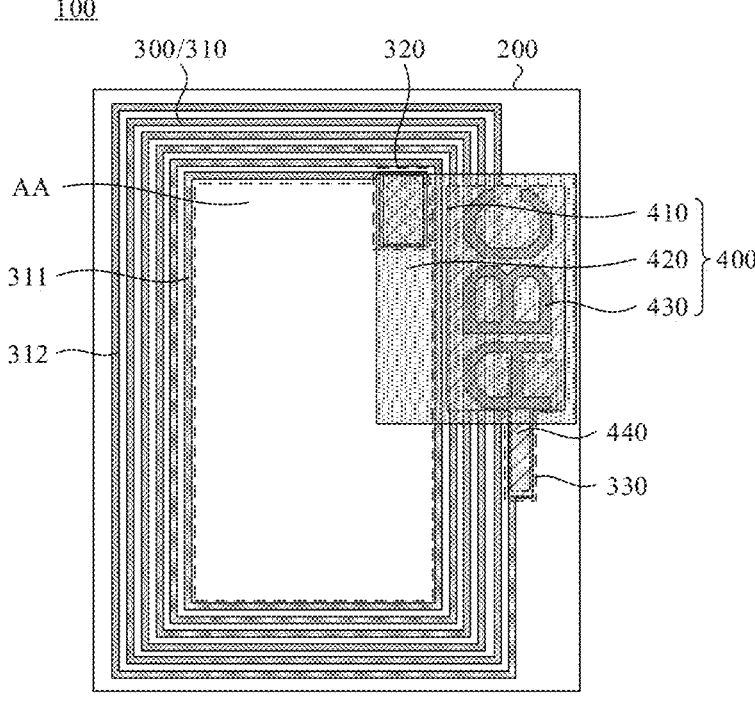
FIG. 46 is yet another structural diagram of a light-emitting device, in accordance with some embodiments.

FIG. 46 is yet another structural diagram of the light-emitting device 100, in accordance with some embodiments.

In addition to the case where the first electrode 410 is at the inner side of the induction coil 300 and the case where the first electrode 410 is at the outer side of the induction coil 300 mentioned above, referring to FIG. 46, in some other embodiments, the orthographic projection of the first electrode 410 on the substrate 200 overlaps with an orthographic projection of at least two turns of conductive wiring 310 on the substrate 200.

In some examples, the first electrode 410 may overlap with all of the conductive wiring 310.

In some examples, the first electrode 410 is neither located at the inner side of nor the outer side of the induction coil 300.

The first electrode 410 may be connected to the innermost turn of conductive wiring 311 or the outermost turn of conductive wiring 312 through the connecting portion 440.

In some examples, by increasing an area of the first electrode 410 overlapping with the induction coil 300, it may be possible to reduce an area of the first electrode 410 located at the inner side of the induction coil 300, and reduce an area of the first electrode 410 located at the outer side of the induction coil 300. As a result, areas of the light-emitting unit 400 located at the inner side of and the outer side of the induction coil 300 may be reduced.

By reducing an area of the first electrode 410 located at the inner side of the induction coil 300, it may be possible to increase the magnetic flux of the induction coil 300, thereby increasing the induced electromotive force in the induction coil 300, and increasing the induced current on the induction coil 300. As a result, the luminance of the light-emitting unit 400 is improved.

By reducing an area of the first electrode 410 located at the outer side of the induction coil 300, it may be possible to reduce the distance between the outermost turn of conductive wiring 312 and the edge of the light-emitting device 100, thereby helping reduce the area of the light-emitting device 100.

Referring to FIG. 46, in some embodiments, an orthographic projection of a portion of the first electrode 410 on the substrate 200 overlaps with the orthographic projection of the at least two turns of conductive wiring on the substrate 200, an orthographic projection of another portion of the first electrode 410 on the substrate 200 is located at the outer side of the orthographic projection of the induction coil 300 on the substrate 200 and is connected to the outermost turn of conductive wiring 312; the second electrode 420 is connected to the innermost turn of conductive wiring 311.

By arranging the orthographic projection of the portion of the first electrode 410 on the substrate 200 to overlap with the orthographic projection of the at least two turns of conductive wiring on the substrate 200, and arranging the orthographic projection of the another portion of the first electrode 410 on the substrate 200 to be located at the outer side of the orthographic projection of the induction coil 300 on the substrate 200, it may be possible to reduce an area of the portion of the first electrode 410 located at the outer side of the induction coil 300, thereby reducing the area of the light-emitting device 100. In addition, the first electrode 410 is not located at the inner side of the induction coil 300. Thus, it may be possible to increase the magnetic flux of the induction coil 300, increase the induced electromotive force and induced current on the induction coil 300, thereby improving the luminance of the light-emitting unit 400.

For example, the first electrode 410 may overlap with the outermost turn of conductive wiring 310 in the induction coil 300.

The orthographic projection of the second electrode 420 on substrate 200 covers at least part of the orthographic projection of the first electrode 410 on substrate 200. In addition, the orthographic projection of the second electrode 420 on substrate 200 may overlap with the orthographic projection of each turn of conductive wiring 310 on substrate 200.

Based on this, the plurality of film layers of the light-emitting device 100 will be described.

Figure 47:
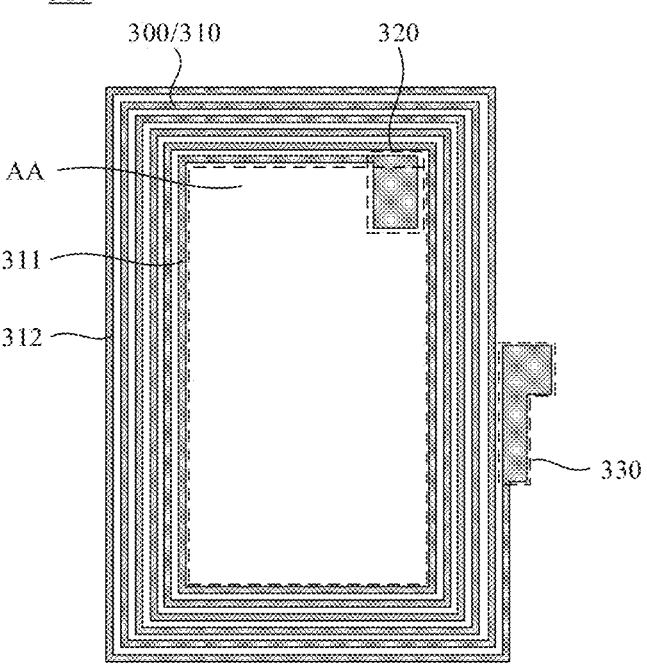
FIG. 47 is yet another structural diagram of a conductive layer of a light-emitting device, in accordance with some embodiments.

FIG. 47 is yet another structural diagram of the conductive layer 510 of the light-emitting device 100, in accordance with some embodiments.

Referring to FIG. 47, the induction coil 300 is included in the conductive layer 510, and the induction coil 300 includes the first end 320 and the second end 330.

Figure 48:
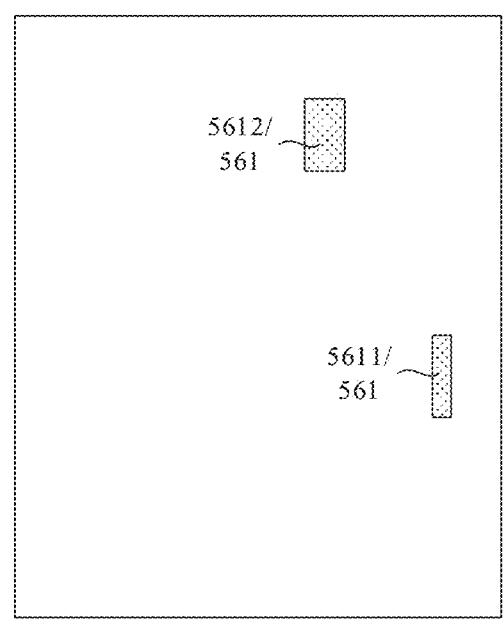
FIG. 48 is yet another structural diagram of an insulating layer of a light-emitting device, in accordance with some embodiments.

FIG. 48 is yet another structural diagram of the insulating layer 560 of the light-emitting device 100, in accordance with some embodiments.

Referring to FIG. 48, the via holes 561 in the insulating layer 560 include the first-type via hole 5611 and the second-type via hole 5612. The orthographic projection of the first-type via hole 5611 on the conductive layer 510 covers the second end 330 (which may refer to FIG. 47), and the orthographic projection of the second-type via hole 5612 on the conductive layer 510 covers the first end 320 (which may refer to FIG. 47).

Figure 49:
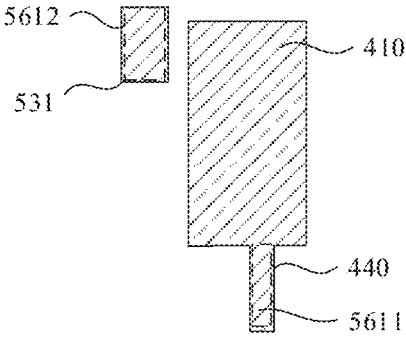
FIG. 49 is yet another structural diagram of a first electrode layer of a light-emitting device, in accordance with some embodiments.

FIG. 49 is yet another structural diagram of the first electrode layer 530 of the light-emitting device 100, in accordance with some embodiments.

Referring to FIG. 49, the first electrode 410, the connecting portion 440 and the first transfer pattern 531 are included in the first electrode layer 530. The first electrode 410 and the connecting portion 440 are connected to each other, and the connecting portion 440 is connected to the second end 330 (as shown in FIG. 47) through the first-type via hole 5611, so that the first electrode 410 and the second end 330 may be electrically connected.

The first transfer pattern 531 is connected to the first end 320 (as shown in FIG. 47) through the second-type via hole 5612.

It will be noted that, the dashed boxes indicated by 5611 and 5612 in FIG. 49 are regions covered by orthographic projections of the first-type via hole 5611 and the second-type via hole 5612 on the first electrode layer 530, respectively.

Figure 50:
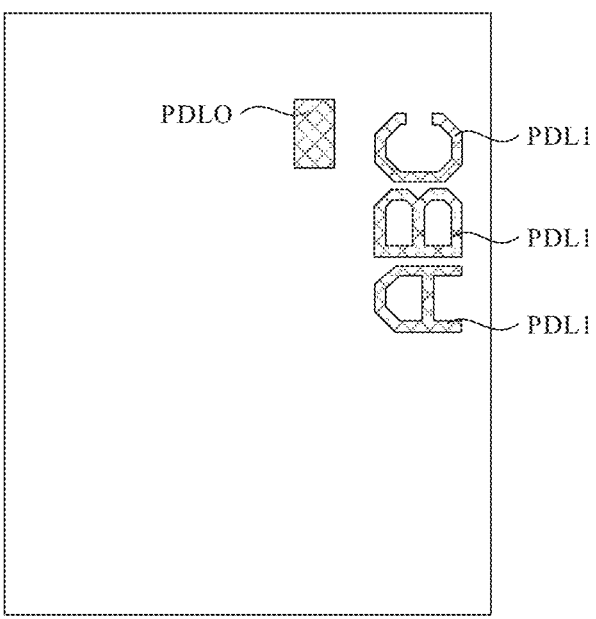
FIG. 50 is yet another structural diagram of a pixel defining layer of a light-emitting device, in accordance with some embodiments.

FIG. 50 is yet another structural diagram of the pixel defining layer PDL of the light-emitting device 100, in accordance with some embodiments.

Referring to FIG. 50, the pixel openings PDL1 and the via hole PDLO are formed in the pixel defining layer PDL.

Figure 51:
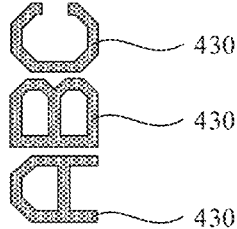
FIG. 51 is yet another structural diagram of a light-emitting layer of a light-emitting device, in accordance with some embodiments.

FIG. 51 is yet another structural diagram of the light-emitting layer EML of the light-emitting device 100, in accordance with some embodiments.

Referring to FIG. 51, the light-emitting layer EML includes at least one light-emitting portion 430. For example, three light-emitting portions 430 are shown in FIG. 51, and the three light-emitting portions 430 share the first electrode 410 and the second electrode 420. The light-emitting portions 430 are located in the pixel openings PDL1.

Figure 52:
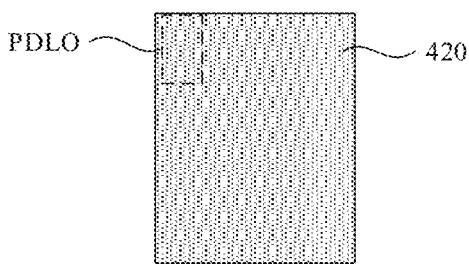
FIG. 52 is yet another structural diagram of a second electrode layer of a light-emitting device, in accordance with some embodiments.

FIG. 52 is yet another structural diagram of the second electrode layer 540 of the light-emitting device 100, in accordance with some embodiments.

Referring to FIG. 52, the second electrode 420 is included in the second electrode layer 540. The second electrode 420 is connected to the first transfer pattern 531 (which may refer to FIG. 49) through the via hole PDLO. It will be noted that, the dashed box indicated by PDLO in FIG. 52 is a region covered by the orthographic projection of the via hole PDLO on the second electrode layer 540.

Figure 53:
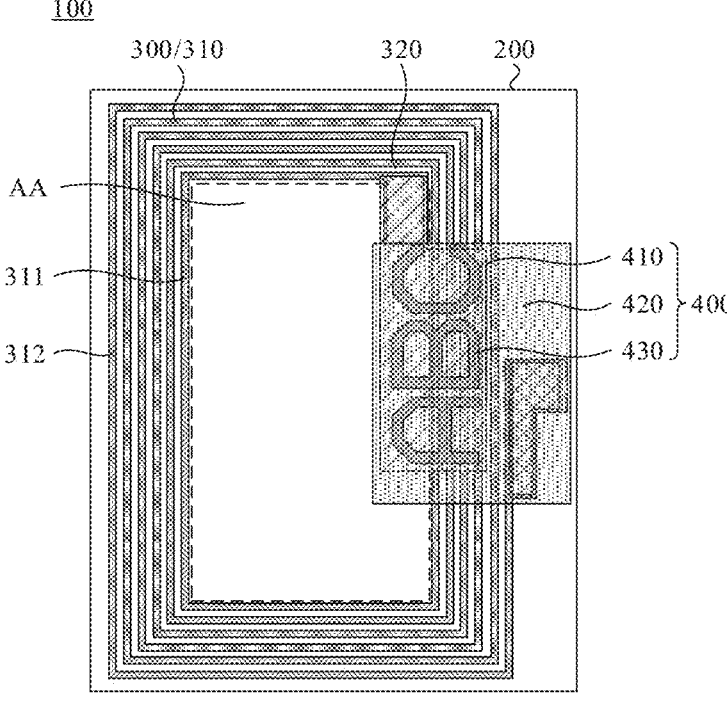
FIG. 53 is yet another structural diagram of a light-emitting device, in accordance with some embodiments.

FIG. 53 is yet another structural diagram of the light-emitting device 100, in accordance with some embodiments.

Referring to FIG. 53, in the case where the orthographic projection of the portion of the first electrode 410 on the substrate 200 overlaps with the orthographic projection of the at least two turns of conductive wiring on the substrate 200, in some embodiments, the orthographic projection of another portion of the first electrode 410 on the substrate 200 may also be located at the inner side of the orthographic projection of the induction coil 300 on the substrate 200, and the another portion of the first electrode 410 is connected to the innermost turn of conductive wiring 311; the second electrode 420 is connected to the outermost turn of conductive wiring 312.

By arranging the orthographic projection of the portion of the first electrode 410 on the substrate 200 to overlap with the orthographic projection of the at least two turns of conductive wiring on the substrate 200, and arranging the orthographic projection of the another portion on the substrate 200 to be located at the inner side of the orthographic projection of the induction coil 300 on the substrate 200, it may be possible to reduce the area of the first electrode 410 located at the inner side of the induction coil 300. Therefore, the magnetic flux of the induction coil 300 may be increased. In addition, the first electrode 410 and the body portion of the second electrode 420 are located at the inner side of the induction coil 300, which may reduce an area of the light-emitting unit 400 located at the outer side of the induction coil 300. Therefore, the light-emitting device 100 may have a relatively small area.

For example, the first electrode 410 may overlap with multiple turns of conductive wiring 310 in the induction coil 300 close to the inner side of the induction coil 300.

The orthographic projection of the second electrode 420 on substrate 200 covers at least part of the orthographic projection of the first electrode 410 on substrate 200. In addition, the orthographic projection of the second electrode 420 on substrate 200 may overlap with the orthographic projection of each turn of conductive wiring 310 on substrate 200.

The embodiments in which the orthographic projection of the first electrode 410 on the substrate 200 overlaps with the orthographic projection of the at least two turns of conductive wiring 310 on the substrate 200 have been described above. In addition, it will be noted that, in the case where the orthographic projection of the portion of the first electrode 410 on the substrate 200 overlaps with the orthographic projection of the at least two turns of conductive wiring on the substrate 200, the number of light-emitting units 400 may be multiple. First electrodes 410 of the at least two light-emitting units 400 are arranged at intervals, and the areas of the orthographic projections, on the substrate 200, of the first electrodes 410 of the at least two light-emitting units 400 are different. The at least two light-emitting units 400 share the second electrode 420.

In summary, the orthographic projection of the first electrode 410 on the substrate 200 may be located at the inner side of or the outer side of the induction coil 300, or may overlap with at least two turns of conductive wiring 310 in the induction coil 300.

In some examples, the light-emitting device 100 may be applied to a lighting device. For example, a mobile phone is provided with a coil therein, and the coil in the mobile phone may be used as the driving coil; when the coil in the mobile phone approaches the induction coil 300 in the light-emitting device 100, the light-emitting unit 400 in the light-emitting device 100 may emit light, so as to lighting for the user.

In addition, the light-emitting device 100 may also be applied to an electronic tag. In this case, multiple light-emitting units 400 in the light-emitting device 100 may display a specific pattern, and when the user brings the mobile phone or other device close to the electronic tag, the multiple light-emitting units 400 may emit light to display the specific pattern.

Moreover, the light-emitting device 100 may also be applied to a counterfeit prevention technology of paper money. When the mobile phone, a smart watch or other device having a coil approaches the light-emitting device 100 in the paper money, the light-emitting unit 400 may emit light, and thus the user may consider the paper money as genuine.

In addition, the light-emitting device 100 may also be applied to an apparatus such as a billboard or a radio frequency card, and the apparatus is not listed here.

Figure 54:
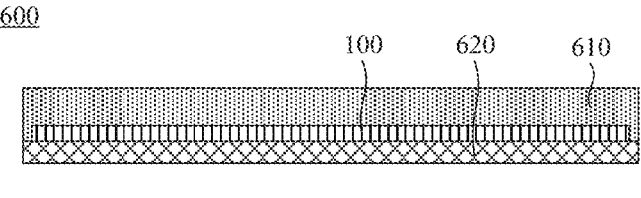
FIG. 54 is a structural diagram of a display apparatus, in accordance with some embodiments.

FIG. 54 is a structural diagram of a light-emitting apparatus 600, in accordance with some embodiments.

Referring to FIG. 54, some embodiments of the present disclosure provide the light-emitting apparatus 600. The light-emitting apparatus 600 includes a first protective layer 610, a second protective layer 620, and the light-emitting device 100 provided in the embodiments above. The light-emitting device 100 is located between the first protective layer 610 and the second protective layer 610.

Since the light-emitting apparatus 600 provided in the embodiments of the present disclosure includes the light-emitting device 100 provided in the embodiments above, the light-emitting apparatus 600 provided in the embodiments of the present disclosure has all the beneficial effects of the light-emitting device 100 provided in the embodiments above, which will not be described here again.

In some examples, the first protective layer 610 and the second protective layer 620 may be made of flexible materials.

In some other examples, the first protective layer 610 and the second protective layer 620 may be made of hard materials.

The first protective layer 610 and the second protective layer 620 may protect the light-emitting device 100 from being damaged.

The light-emitting apparatus 600 may be an apparatus such as the lighting apparatus, the paper money, the electronic tag, the radio frequency card or the billboard, which will not be listed here.

The foregoing descriptions are merely specific implementations of the present disclosure, but the protection scope of the present disclosure is not limited thereto. Any changes or replacements that a person skilled in the art could readily conceive of within the technical scope of the present disclosure shall be included in the protection scope of the present disclosure. Therefore, the protection scope of the present disclosure shall be subject to the protection scope of the claims.

What is claimed is:

1. A light-emitting device, comprising:
a substrate;
an induction coil located on a side of the substrate; the induction coil including a plurality of turns of conductive wiring disposed helically around a central region; and
at least one light-emitting unit located on a side of the induction coil away from the substrate; a light-emitting unit in the at least one light-emitting unit includes a first electrode and a second electrode, one of the first electrode and the second electrode is connected to an innermost turn of conductive wiring in the induction coil, and another one of the first electrode and the second electrode is connected to an outermost turn of conductive wiring in the induction coil;
wherein an area of a portion of the central region covered by the at least one light-emitting unit in a direction perpendicular to the substrate is less than or equal to 50% of an area of the central region; and
the light-emitting unit further includes at least one light-emitting portion located between the first electrode and the second electrode; a total orthographic projection of the at least one light-emitting portion on the substrate lies only within both a total orthographic projection of the first electrode on the substrate and a total orthographic projection of the second electrode on the substrate.

2. The light-emitting device according to claim 1, wherein an area of a portion of the induction coil covered by the at least one light-emitting unit in the direction perpendicular to the substrate is less than or equal to 15% of an area of the induction coil.

3. The light-emitting device according to claim 1, wherein an orthographic projection of the first electrode on the substrate is located at an outer side of an orthographic projection of the induction coil on the substrate.

4. The light-emitting device according to claim 3, wherein an orthographic projection of the second electrode on the substrate covers at least part of the orthographic projection of the first electrode on the substrate, and the second electrode crosses the plurality of turns of conductive wiring and is connected to the innermost turn of conductive wiring;
the first electrode is electrically connected to the outermost turn of conductive wiring.

5. The light-emitting device according to claim 4, wherein the second electrode is located on a side of the first electrode away from the substrate; and
the light-emitting unit further includes a first transfer pattern, and the first transfer pattern is disposed in a same layer as the first electrode; the second electrode is connected to the first transfer pattern through a via hole, and the first transfer pattern is connected to the innermost turn of conductive wiring through another via hole.

6. The light-emitting device according to claim 5, wherein an orthographic projection of the first transfer pattern on the substrate is located at an inner side of the orthographic projection of the induction coil on the substrate.

7. The light-emitting device according to claim 5, wherein the first transfer pattern crosses the plurality of turns of conductive wiring; and
the first transfer pattern includes a first portion, a second portion and a third portion; an orthographic projection of the first portion on the substrate is located at an inner side of the orthographic projection of the induction coil on the substrate, an orthographic projection of the second portion on the substrate covers part of an orthographic projection of the plurality of turns of conductive wiring on the substrate, and an orthographic projection of the third portion on the substrate is located at the outer side of the orthographic projection of the induction coil on the substrate;
wherein the second electrode is connected to at least one of the first portion, the second portion and the third portion through the via hole.

8. The light-emitting device according to claim 3, wherein an orthographic projection of the second electrode on the substrate is substantially located at the outer side of the orthographic projection of the induction coil on the substrate; and
the second electrode is located on a side of the first electrode away from the substrate;

the light-emitting unit further includes a first bridging pattern disposed in a same layer as the first electrode; an end of the first bridging pattern is connected to the innermost turn of conductive wiring through a via hole, and another end of the first bridging pattern crosses the plurality of turns of conductive wiring and is connected to the first electrode;

the second electrode is connected to the outermost turn of conductive wiring.

9. The light-emitting device according to claim 8, wherein the first bridging pattern and the first electrode are sequentially arranged along a first direction;

in a second direction, a width of the first bridging pattern is less than a width of the first electrode; the second direction is perpendicular to the first direction, and the second direction is parallel to the substrate.

10. The light-emitting device according to claim 3, wherein an orthographic projection of the second electrode on the substrate is substantially located at the outer side of the orthographic projection of the induction coil on the substrate; and the second electrode is located on a side of the first electrode away from the substrate;

the light-emitting unit further includes a first bridging pattern disposed in a same layer as the first electrode; an end of the first bridging pattern is connected to the innermost turn of conductive wiring through a via hole, and another end of the first bridging pattern crosses the plurality of turns of conductive wiring and is connected to the second electrode through another via hole;

the first electrode is connected to the outermost turn of conductive wiring.

11. The light-emitting device according to claim 1, wherein an orthographic projection of the first electrode on the substrate is located at an inner side of an orthographic projection of the induction coil on the substrate;

an orthographic projection of the second electrode on the substrate covers at least part of the orthographic projection of the first electrode on the substrate, and the second electrode crosses the plurality of turns of conductive wiring and is connected to the outermost turn of conductive wiring.

12. The light-emitting device according to claim 11, wherein the second electrode is located on a side of the first electrode away from the substrate;

the light-emitting unit further includes a third transfer pattern, and the third transfer pattern is disposed in a same layer as the first electrode; the second electrode is connected to the third transfer pattern through a via hole, and the third transfer pattern is connected to the outermost turn of conductive wiring through another via hole.

13. The light-emitting device according to claim 1, wherein an orthographic projection of the first electrode on the substrate and an orthographic projection of the second electrode on the substrate are both located at an inner side of an orthographic projection of the induction coil on the substrate; the first electrode is electrically connected to the innermost turn of conductive wiring; and the second electrode is located on a side of the first electrode away from the substrate;

the light-emitting unit further includes a second bridging pattern, and the second bridging pattern is disposed in a same layer as the first electrode; an end of the second bridging pattern is connected to the outermost turn of conductive wiring through a via hole, and another end of the second bridging pattern crosses the plurality of turns of conductive wiring and is connected to the second electrode through another via hole.

14. The light-emitting device according to claim 1, wherein an orthographic projection of the first electrode on the substrate overlaps with an orthographic projection of at least two turns of conductive wiring in the plurality of turns of conductive wiring on the substrate.

15. The light-emitting device according to claim 14, wherein an orthographic projection of a portion of the first electrode on the substrate overlaps with the orthographic projection of the at least two turns of conductive wiring on the substrate, and an orthographic projection of another portion of the first electrode on the substrate is located at an outer side of an orthographic projection of the induction coil on the substrate; the another portion of the first electrode is connected to the outermost turn of conductive wiring;

the second electrode is connected to the innermost turn of conductive wiring.

16. The light-emitting device according to claim 14, wherein an orthographic projection of a portion of the first electrode on the substrate overlaps with the orthographic projection of the at least two turns of conductive wiring on the substrate, and an orthographic projection of another portion of the first electrode on the substrate is located at an inner side of the orthographic projection of the induction coil on the substrate; the another portion of the first electrode is connected to the innermost turn of conductive wiring;

the second electrode is connected to the outermost turn of conductive wiring.

17. The light-emitting device according to claim 1, wherein the at least one light-emitting unit includes multiple light-emitting units; first electrodes of at least two light-emitting units in the multiple light-emitting units are disposed at intervals, and areas of orthographic projections, on the substrate, of the first electrodes of the at least two light-emitting units are different;

the at least two light-emitting units share a second electrode thereof.

18. The light-emitting device according to claim 17, wherein the at least two light-emitting units further share a connecting portion thereof, the connecting portion is disposed in a same layer as the first electrodes of the at least two light-emitting units; and the first electrodes of the at least two light-emitting units are electrically connected to the induction coil through the connecting portion.

19. The light-emitting device according to claim 1, wherein the first electrode is an anode, and the second electrode is a cathode.

20. A light-emitting apparatus, comprising:

a first protective layer and a second protective layer; and the light-emitting device according to claim 1, the light-emitting device is located between the first protective layer and the second protective layer.

* * * * *